United States Patent [19]
Horiuchi et al.

[11] Patent Number: 5,391,912
[45] Date of Patent: * Feb. 21, 1995

[54] SEMICONDUCTOR DEVICE HAVING POLYCRYSTALLINE SILICON REGION FORMING A LEAD-OUT ELECTRODE REGION AND EXTENDED BENEATH ACTIVE REGION OF TRANSISTOR

[75] Inventors: Masatada Horiuchi, Koganei; Kazuo Nakazato, Kokubunji, both of Japan

[73] Assignee: Hitachi, Ltd., Tokyo, Japan

[ * ] Notice: The portion of the term of this patent subsequent to Jul. 13, 2010 has been disclaimed.

[21] Appl. No.: 963,696

[22] Filed: Oct. 20, 1992

Related U.S. Application Data

[63] Continuation of Ser. No. 648,309, Jan. 29, 1991, Pat. No. 5,227,660, which is a continuation of Ser. No. 268,738, Nov. 8, 1988, abandoned.

[30] Foreign Application Priority Data

| | | |
|---|---|---|
| Nov. 9, 1987 [JP] | Japan | 62-281033 |
| Nov. 20, 1987 [JP] | Japan | 62-292019 |
| Jan. 25, 1988 [JP] | Japan | 63-12518 |

[51] Int. Cl.$^6$ ............... H01L 29/04; H01L 29/72
[52] U.S. Cl. .................... 257/588; 257/64; 257/627; 257/486; 257/754; 257/773
[58] Field of Search ............... 257/588, 64, 577, 627, 257/477, 486, 506, 754, 755, 773

[56] References Cited

U.S. PATENT DOCUMENTS

| | | | |
|---|---|---|---|
| 4,839,309 | 6/1989 | Easter et al. | 437/162 |
| 4,984,048 | 1/1991 | Sagara et al. | 257/587 |
| 5,227,660 | 7/1993 | Horiuchi et al. | 257/588 |

*Primary Examiner*—Mark V. Prenty
*Attorney, Agent, or Firm*—Antonelli, Terry, Stout & Kraus

[57] ABSTRACT

This invention relates to a semiconductor device, in which a singlecrystal semiconductor substrate whose principal surface is (111) is etched from the principal surface thereof in the direction perpendicular thereto to form a vertical trench and a lateral trench is formed at the bottom portion of the side wall of the vertical trench by effecting an anisotropic etching with respect to crystallographical axes so that the etching proceeds in the direction of <110> axis, the lateral and the vertical trenches being filled with polycrystalline or amorphous semiconductor or insulator.

12 Claims, 18 Drawing Sheets

F I G. 23
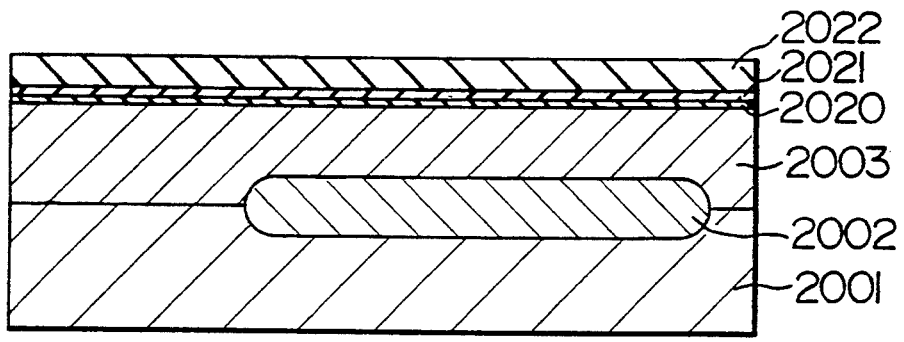
F I G. 24
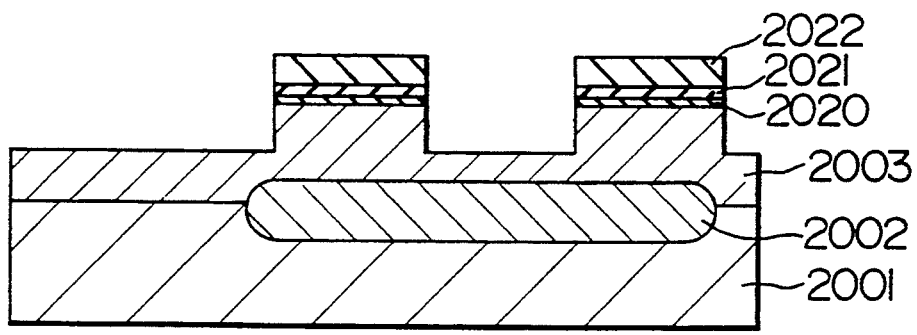
F I G. 25
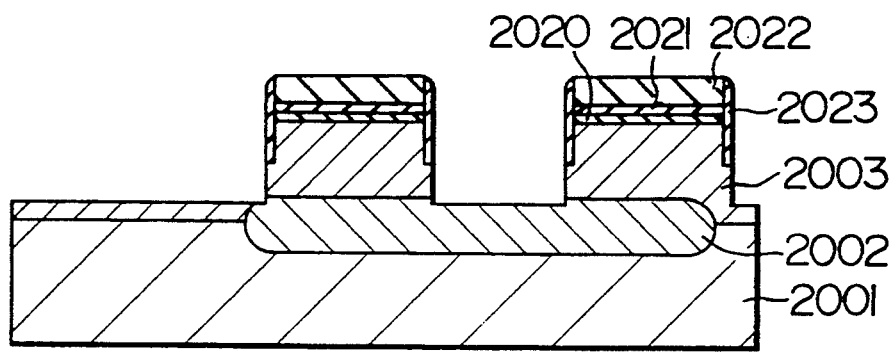

F I G. 35
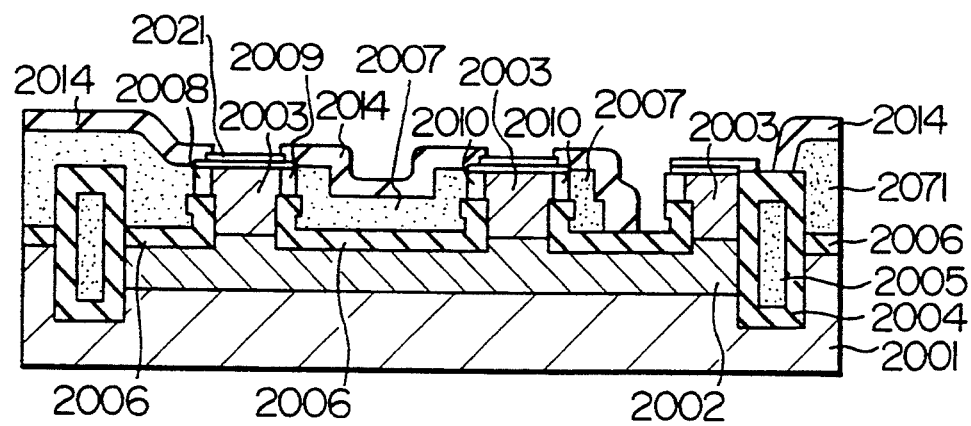
F I G. 36
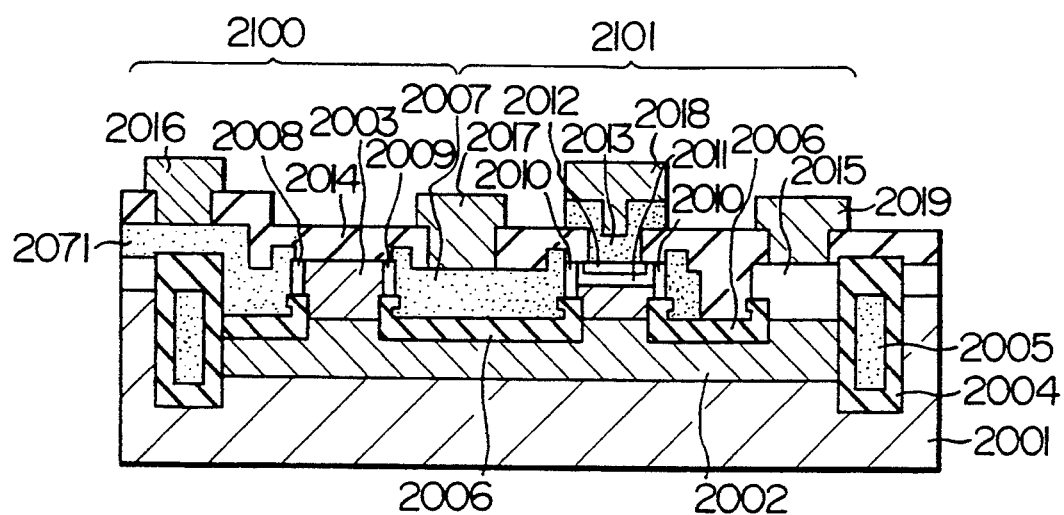

SEMICONDUCTOR DEVICE HAVING POLYCRYSTALLINE SILICON REGION FORMING A LEAD-OUT ELECTRODE REGION AND EXTENDED BENEATH ACTIVE REGION OF TRANSISTOR

This is a continuation of application Ser. No. 648,309, filed Jan. 29, 1991, now U.S. Pat. No. 5,227,660, which is a continuation of application Ser. No. 268,738, filed Nov. 8, 1988, now abandoned.

BACKGROUND OF THE INVENTION

This invention relates to a semiconductor device and a method for fabricating same, and in particular to a semiconductor device, in which at least a lateral trench is formed in the interior of a single-crystal semiconductor substrate having a principal surface, which trench is filled with a substance other than the singlecrystal semiconductor, and a method for fabricating the same.

Heretofore it is well known to form an $n^+$ or $P^+$ conductivity type buried layer in the interior of a single-crystal semiconductor substrate having a principal surface (JP-A-56-1556), to form a capacitance by burying an insulating material therein (ISSCC 84/FRIDAY, Feb. 24, 1984/CONTINENTAL 5-9/11:45 A.M.) by a buried an insulator for taking-out an electrode (JP-A-59-161867, JP-A-61-237471), etc. For forming such various sorts of buried layers, heretofore, the epitaxial technique and a high energy ion implantation technique have been widely utilized. However all these techniques have had several problems.

At first consider a bipolar transistor having an $n^+$ conductivity type buried layer disclosed in JP-A-56-1556. FIG. 42 shows the construction of this transistor. In the figure reference numeral 1 is a p conductivity type Si substrate; 7 is an isolation insulating layer; 8 is a deep trench isolation insulating layer; 9 is a trench filling Si layer; 10 is a base taking-out electrode; 153 is an $n^+$ conductivity type diffusion layer for taking-out an $n^+$ conductivity type buried layer 152; 141 is a surface protecting insulating layer; 16 is an emitter taking-out electrode; 18 is a base electrode; 19 is an emitter electrode; and 20 is a collector electrode. That is, the epitaxial layer 200 is formed on a collector region consisting of an $n^+$ conductivity type diffusion layer 152 and that an intrinsic base region 13, an $n^+$ conductivity type emitter region 17, etc. are constructed within the epitaxial layer 200.

The buried layer may be formed also by the method, by which high energy ions are implanted in the Si substrate.

By the method described above the epitaxial layer 152 is unnecessary and the base region 13 and the emitter region 17 are formed after the formation of the $n+$ conductivity type buried layer.

In the bipolar transistor fabricated by the prior art techniques described above it is required that the $n^+$ conductivity type buried diffusion layer 152 used as the collector has a low resistance for increasing the operation speed of the transistor and an abrupt impurity concentration distribution. In particular, for the $n^+$ conductivity type buried diffusion layer 152 antimony (Sb) has been used as diffused impurities in order to prevent impurity outward diffusion in the step of forming the epitaxial layer 200 on the $n^+$ conductivity type buried diffusion layer 152 or variations in the impurity distribution in a succeeding step for high temperature heat treatment. However since the solid solubility of Sb into Si is as low as $3-5 \times 10^{19}$ cm$^{-3}$, even the sheet resistance of an $n^+$ conductivity type buried diffusion layer 1.5 $\mu$m thick is essentially as high as 30 $\Omega/\square$. Therefore it was difficult to reduce the collector resistance.

Further, during the growth of the epitaxial layer 200 on the $n^+$ conductivity type buried diffusion layer 152 constructed selectively, positional deviations from the buried diffusion layer pattern due to the dependence of the epitaxial growth speed on the crystal-lographical surface orientation are unavoidable. This caused a hindrance to the reduction of the size and the increase in the degree of integration of elements. Further there was another problem that it was difficult to deal with a large quantity of products in a conventional epitaxial growth apparatus, which raised the production cost.

On the contrary, by the method, by which the $n^+$ conductivity type buried layer 152 is formed by high energy ion implantation, all the problems described above concerning the formation of the epitaxial layer 200 are solved. However, it is known that by the high energy ion implantation implanted ions are not distributed symmetrically with respect to the maximum concentration range, but the distribution has a long tail from the position of the maximum concentration towards the surface of the semiconductor substrate. Therefore there remained a problem that no abrupt impurity distribution could be Obtained. Furthermore, the high energy ion implantation method has still another problem that crystal defects are produced during the formation of a high impurity concentration buried layer and that it is difficult to restore the crystallographical property even by a succeeding heat treatment step. Therefore by this method no excellent junction characteristics could be obtained.

Still another problem of the prior art techniques concerning the $n^+$ conductivity type buried diffusion layer 152 consists in that the occupation area required for the taking-out of the collector and the wiring is large, which causes a hindrance to the reduction of the size and the increase in the degree of integration of elements. Furthermore still another problem concerning the increase in the degree of integration consists in that a sufficiently great interval or an element isolating region having a sufficiently great depth is required for isolating adjacent $n^+$ conductivity type buried diffusion layers.

Another problem of the prior art techniques concerns a memory device whose constituent elements are transistors having a prior art structure. That is, in a prior art semiconductor memory device, although the $n^+$ conductivity type buried diffusion layer 152 has been used as a region for storing information, a measure should be taken in the circuit for preventing destruction of stored information due to a large number of electrons produced by $\alpha$ ray irradiation within the semiconductor substrate 1, so-called soft error misoperation. This has caused a serious problem against the decrease in the storage charge density of the memory device.

An object of this invention is to provide a bipolar transistor including a buried impurity layer having a low resistivity and an abrupt impurity distribution, for which production of crystal misoperation is not feared and which can solve the problems of the prior art techniques, by means of which a transistor of a superfine and super high integration is possible and which transistor is thus not expensive.

Another object of this transistor is to provide a bipolar transistor memory, in which no α-ray soft errors are produced.

Next the DRAM (Dynamic Random Access Memory) disclosed in ISSCC 84/FRIDAY, Feb. 24, 1984/CONTINENTAL 5-9/11:45 A.M.) will be considered. FIG. 43A is a cross-sectional view illustrating the construction of this DRAM and FIG. 43B indicates an equivalent circuit thereof, in which reference numeral 1100 is a p+ conductivity type semiconductor substrate; 1030 is a p− conductivity type epitaxial layer; 1031 is a field oxide layers 1032 and 1321 are n+ conductivity type drain diffusion layers, which are bit lines formed in the direction perpendicular to the sheet of the figure; 1033 and 1331 are capacitor oxide layers; and 1034 is a polycrystalline Si storage electrode serving as an electrode of a capacitor element constituted between that p+ conductivity type semiconductor element and itself. Further 1035 and 1351 are n+ conductivity type buried source diffusion layers and 1036 and 1361 are gate oxide layers of vertical type MOS switching transistors; and 1037 indicates word lines made of polycrystalline Si serving as gate electrodes of switching transistors A and B. In the DRAM cell indicated in FIG. 43A, a transistor and a capacitor element are buried at each intersection of every word line and every bit line. Consequently, contrarily to the fact that the reduction of the size of the memory cell having a usual structure is based on the reduction of the size of the processing, the memory cell indicated in FIG. 43B is characterized in that the area of a cell can be significantly reduced with respect to the cell having a usual structure in spite of a same design rule.

Although the prior art techniques are efficient for the remarkable reduction of the size of each cell, no attention is paid to mutual interference between adjacent cells. Therefore, they have had a problem that the integration is hindered. That is, in the construction indicated in FIG. 43A, in which adjacent cells are close to each other, current paths are produced between the n+ conductivity type drain diffusion layers 1032 and 1321 or the n+ conductivity type buried source diffusion layers 1035 and 1351 in the switching transistor portion, which has given rise to a problem that erroneous operations take place. This problem of the production of current paths is more serious between buried sources.

Furthermore, the prior art techniques have had a problem that the resistance against erroneous operations due to the α ray irradiation, so-called soft error misoperation, in not sufficient. Pairs of electron and hole are generated within the semiconductor substrate by the α-ray irradiation and electrons are diffused towards the surface of the structure. However, in the structure indicated in FIG. 43A, polycrystalline Si storage electrodes 1034 and 1341, which are charge storage regions, are enclosed by oxide layers 1033 and 1331 and no soft error misoperation are produced in these parts. Further the semiconductor substrate is also of P+ conductivity type, the life time of electrons is short, and the resistance against soft error is better than that of the usual construction. However, since electrons diffused to the neighborhood of the surface of the substrate are trapped by the buried source diffusion layer 1035 or 1351, the problem of the erroneous operations due to soft errors is not solved even by the memory cell having the structure as indicated in FIG. 43A.

Another problem of the structure described above concerns the formation of the p− conductivity type epitaxial layer on the p+ conductivity type semiconductor substrate. That is the P conductivity type high impurity concentration substrate is formed usually by using boron (B) as added impurity. However, since the diffusion coefficient of B is great, there is a problem that redistribution of impurity is produced easily by high temperature heat treatment, which is unavoidable in the fabrication process. Consequently this has given rise to problems that the breakdown voltage of the buried source diffusion layers 1035 and 1351 is lowered by the redistribution of B to the p− conductivity type epitaxial layer 1030, that the threshold voltage of switching transistors is raised, etc. Another problem of the prior art structure described above consists in that the word line 1037 and the storage electrodes 1034 and 1341 are adjacent to each other only through the thin oxide films 1036 and 1361. That is, the potential of the storage electrode is apt to be interfered by the word line signal, which gives rise easily to a problem of write-in thereof, etc.

An object of this invention is to provide a DRAM cell, which can remove the disadvantages of the memory cell having the prior art structure; in which no problems such as interference between cells, interference between word lines, α-ray soft error, etc. are produced; for which redistribution of p+ conductivity type impurities is not feared; and by means of which a superfine and a high density integration are possible.

Next a buried insulating layer for taking-out an electrode disclosed in JP-A-59-161867 is indicated in FIG. 44, in which reference numeral 2001 is a p conductivity type Si singlecrystal substrate, whose principal surface is (100) plane; 2100 is lateral type pnp transistor; 2101 is a vertical type npn transistor; 2002 is an n+ conductivity type buried layer; 2061 a buried insulating layer made of SiO$_2$; 2008, 2009 and 2010 are p+ conductivity type diffusion layers, which are the emitter region and the collector region of the lateral type pnp transistor 2100 and the graft base region of the vertical type npn transistor 2101, respectively; 2011 is a p conductivity type diffusion layer region, which is the intrinsic base region of the vertical type npn transistor 2101; 2012 and 2015 are the n+ conductivity type emitter region and the n+ conductivity type collector region, respectively, of the vertical type pnp transistor 2101; 2071 is an emitter taking-out electrode of the lateral type pnp transistor 2100 made of polycrystalline Si; 2007 is the collector taking-out electrode of the lateral type pnp transistor 2100, serving also as the base taking-out electrode of the vertical type npn transistors 2101; 2013 is the emitter taking-out electrode of the vertical type npn transistor 2101; 2014 is an insulating layer; 2016, 2017, 2018 and 2019 are the emitter electrode and the collector electrode of the lateral type pnp transistor 2100 and the emitter electrode and the collector electrode of the vertical type npn transistor 2101, respectively, made of metal layers, whose principal component is Al. The collector electrode 2017 of the lateral type pnp transistor 2100 serves also as the base electrode of the vertical type npn transistor 2101.

In a known bipolar transistor having the structure as indicated in FIG. 44, all the base-collector junction outside of the active region of the vertical type npn transistor 2101, and the base-collector and the base-emitter junctions of the lateral type pnp transistor 2100 are replaced by thick insulating layers 2061 so that the parasitic capacitance is significantly reduced. Furthermore, since the graft base 2010 constituted by a p+ conductivity type diffusion layer is formed also on a buried insulating layer 2061, the shortest path between the n+ conductivity type buried layer 2002 serving as a collector and the base is increased and the base-collector breakdown voltage is improved. Consequently the transistor having the structure indicated in FIG. 44 has advantages to have a high breakdown voltage and to achieve a high speed operation.

In such a bipolar transistor a thick buried insulating layer 2061 has been formed ① by selective oxidation of the bottom portion of a trench formed by etching the semiconductor substrate 1 in the direction perpendicular to the principal surface thereof by sputter ion etching, ② by selective oxidation of a surface obtained by etching isotropically the bottom of the trench, and ③ by making a water-drop-shaped single-crystal region amorphous by implanting ions selectively in the bottom portion of the trench and by selectively oxidizing a surface obtained by selectively removing this amorphous region. By either one of the methods ① to ③ it is not possible to extend satisfactorily the buried insulating layer 2061 in the lateral direction so as to be positioned below the graft base 2010 and none of them is used in practice. By the method indicated by ①, since the extension of the graft base 2010 formed by using the base taking-out electrode 2007 as a diffusion source due to heat treatment, etc. in the fabrication process is much faster than the oxide film growth of the buried insulating layer 2061, it is almost impossible to construct the buried insulating layer 2061 below the graft base 2010 by the present technique. In the case where it is formed by the method indicated by ②, if the amount of the isotropic etching is increased, it is possible to extend satisfactorily the region of the formation of the buried insulating layer 2061 in the lateral direction. However, since the tunnel making is advanced also in the vertical direction, the n+ conductivity type buried layer 2002 is corroded wastefully. Therefore this has given rise to a problem of undesirably increasing the collector resistance and at the same time hindering the reduction of the size. By the method indicated by ③, by which the buried insulating layer 2061 is extended in the lateral direction within the singlecrystal substrate 2001, the degree of the extension in the lateral direction is determined unequivocally by the conditions of the ion implantation on the basis of characteristics of the lateral extension of the amorphous layer by the ion implantation. However, in order to realize a lateral extension of desired size and, in particular, a lateral extension above several 100 nm, it is indispensable to use a high current ion implantation apparatus having a high acceleration energy from several 100 keV to several MeV. Therefore this method has had a drawback that semiconductor devices could not be fabricated in a simple manner with a low cost. Further secondary misoperation due to high energy and high current ion implantation are produced within the singlecrystal substrate 2001, from which the amorphous layer is selectively removed, which has been apt to give rise to a problem to worsen electric characteristics such as increase in leak current, etc.

An object of this invention is to realize a semiconductor device comprising a protruding semiconductor region formed in a surface region of a semiconductor substrate; buried insulating layers formed at least on both the side of the bottom of the protruding semiconductor region on the surface of the semiconductor substrate; a taking-out (lead-out) electrode layer, which is in contact with a side wall of the protruding semiconductor region and which is formed on the buried insulating layer; and a region doped with impurity, which is formed on the side wall portion in the protruding semiconductor region in contact with the taking-out electrode layer, in which the end portion of the buried insulating layer formed at the bottom portion of the side wall in the protruding semiconductor region extends satisfactorily towards the central portion of the protruding semiconductor region.

Further, speaking more concretely concerning the bipolar transistor, the object of this invention is to provide a superfine and super high speed bipolar transistor having a buried insulating layer separating the graft base from the high impurity concentration buried collector diffusion layer to a desired extent in the lateral direction in a desired region without impairing the reduction of the size, which can be fabricated with a high controllability by a simple fabrication process.

Next the buried insulating layer for taking-out an electrode disclosed in JP-A-61-237471 is indicated in FIG. 45, in which reference numeral 2001 is a p conductivity type Si singlecrystal substrate, for which a (100) plane is usually used as the principal surface from the point of view of reducing surface energy levels; 2200 is an isolation insulating layer separating elements, 2030 is a gate insulating layer; 2040 is a gate electrode; 2050 is a gate protecting insulating layer; 2080 is a gate side wall insulating layer; 2091 is a source taking-out (lead-out) electrode; 2092 is a drain taking-out (lead-out) electrode; 2710 is a buried insulating layer; 2110 and 2111 are a source diffusion layer and a drain diffusion layer, respectively; and 2130 and 2140 are a source electrode and a drain electrode, respectively. Since in an MOS transistor having the prior art structure indicated in FIG. 45, the buried insulating layer 2710 can be constructed so that it is sufficiently thick, the transistor is characterized in that the parasitic capacitance component can be satisfactorily reduced with respect to that in an MOS transistor having a usual structure and therefore the operation speed is increased.

In such an MOS transistor, the buried insulating layer 2710 has been fabricated by selective oxidation of the etching region on the Si substrate 2001, on which the gate electrode 2040 serving as a mask was formed. Consequently the transistor was not so constructed that the buried insulating layer was extended to the side wall portion of the source-drain junction in the Si substrate region below the gate electrode 2040 and thus it was impossible to realize such a structure.

The structure of the buried insulating layer 2710 will be evaluated by the numerical analyzing method from the point of view of the improvement of the performance, and in particular the increase of the breakdown voltage and the high current density of a superfine MOS transistor and obtained results will be explained. That is, in the structure, in which the buried insulating layer 2710 is formed at the bottom portion of the source-drain junction such as in the prior art structure, although the effect to reduce the parasitic capacitance can be obtained, the effect to alleviate the drain high electric field is not obtained at all. Consequently, in an MOS transistor having an extremely short channel the prior art structure is not at all efficient with respect to the improvement of the effect because of a strong electric field on the drain side, i.e. the so-called short channel effect and the phenomenon of the lowering of the punchthrough voltage. From the point of view of the short channel effect and the increase of the punch-through voltage it is desirable to form a thick insulating layer at the side portion of the drain junction so as to absorb the drain strong electric field.

According to the prior art technique indicated in FIG. 45, a method for burying an insulating layer by the thermal oxidation method or the deposition method at a region, where the side surface of the drain junction is to be formed, after having selectively removed the region by etching using a fluoric acid and nitric acid mixed solution, microwave etching, etc., is also conceivable. However, by the method described above, since the etching proceeds isotropically and there is a problem in its controllability, it is feared that essential disadvantages take place that the semiconductor substrate portion corresponding to the channel region is also etched, that the portion is made to be insulating, etc. and therefore this method is not practical.

Another object of this invention is to construct a thick insulating layer with a good controllability related to the self-alignment with the gate electrode at the side surface portion of the drain junction in the semiconductor substrate right below the gate electrode by the same structure as described for the bipolar transistor.

SUMMARY OF THE INVENTION

In order to achieve the above objects, according to this invention, a vertical tunnel is formed in the direction perpendicular to the principal surface of the semiconductor substrate and then a lateral tunnel is formed from the bottom portion of the vertical tunnel in the direction parallel to the principal surface by anisotropic etching depending on the crystallographical orientation. The vertical and lateral tunnels are filled with polycrystalline or amorphous semiconductor doped with impurity or insulator. In order to make it possible to form the lateral tunnel parallel to the principal surface of the semiconductor substrate by the anisotropic etching, according to this invention, a semiconductor, whose principal surface is a (111) plane, is used and the lateral tunnel is located in the direction of <110>, which is perpendicular to <111>. If an $N_2H_4$ or kOH solution is used for the anisotropic etching, the etching in the direction of <111> and the etching of a silicon oxide layer and a nitride layer are negligibly small. Consequently the control of the end point of the lateral tunnel can be effected by constructing the whole active region so as to be enclosed by an insulating layer within the deep concave. The isolation from adjacent transistors and the removal of α-ray soft errors can be achieved by isolating the transistor from the semiconductor substrate if an insulating layer is formed selectively at the lateral tunnel and the bottom portion of the vertical tunnel before the filling with a semiconductor thin film.

Since the lateral and vertical tunnels described above can be formed even after having formed the base diffusion layer region or the emitter diffusion layer region, it is not necessary to dispose any epitaxial layer and it is possible to shorten remarkably the period, during which the semiconductor body is exposed to a high temperature heat treatment. Consequently it is possible to realize a buried diffusion layer having a high impurity concentration and, moreover, an abrupt distribution by using P or As, whose solid solubility is higher than Sb as doped impurity.

Furthermore, if the lateral tunnel and the bottom portion of the vertical tunnel is selectively oxidized before the filling with the semiconductor layer described above, the whole element is completely isolated from the semiconductor substrate. Consequently erroneous operations such as α-ray soft errors, interference between adjacent transistors, etc. can be removed completely. Further, if the semiconductor layer is taken-out on the surface of the semiconductor, it can be used also as electrode wiring. Consequently the area of the collector electrode region is reduced and freedom of the circuit construction is increased, which makes it easier to increase the degree of integration.

The formation of the lateral tunnel according to this invention can be realized by anisotropic etching depending strongly on the crystallographical surface orientation. For example, when an $N_2H_4$ or KOH solution is used, the etching speed for Si in the direction <111> and for insulating layers such as $SiO_2$, $Si_3N_4$, etc. is significantly smaller than that for Si in the directions <100> and <110>. Consequently, after having constructed an active region enclosed by a deep trench isolating insulating layer in a semiconductor substrate having a principal surface (111), a vertical tunnel is formed at a desired position in the active region and with the insulating layer left at the upper portion of the vertical tunnel, the anisotropic etching described above is effected. In this way etching proceeds in the direction <110>, which is parallel to the principal surface, and a lateral tunnel, both the ceiling surface and the bottom surface of which are parallel to the principal surface, is formed all over the active region. The region, where the lateral tunnel is formed, is the region enclosed by the deep trench isolating insulating layer. Therefore the controllability and the reproducibility thereof give rise to no problems.

BRIEF DESCRIPTION OF THE DRAWINGS

FIGS. 14A, 14B to 19A, 19B are cross-sectional views indicating fabrication steps of a semiconductor memory device, which is a fourth embodiment of this invention, A and B representing cross-sections, which are perpendicular to each other;

FIGS. 23 to 30 are cross-sectional views illustrating fabrication steps for fabricating a bipolar transistor, which is a sixth embodiment of this invention;

FIGS. 31 to 36 are cross-sectional views illustrating fabrication steps for fabricating another bipolar transistor, which is a seventh embodiment of this invention;

DESCRIPTION OF THE PREFERRED EMBODIMENTS

Figure 1:
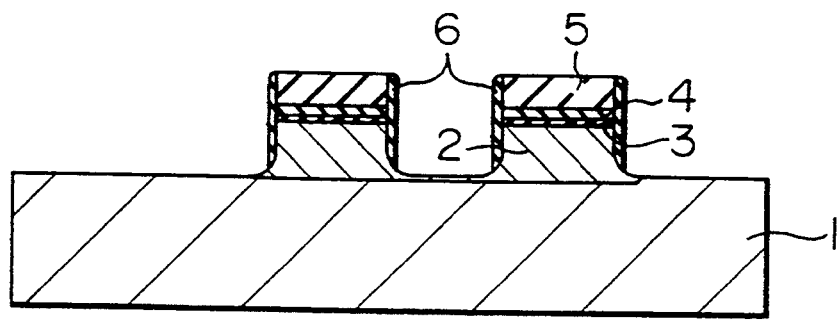
FIGS. 1 to 5 are cross-sectional views illustrating a first embodiment of this invention in the order of the fabrication steps.

Hereinbelow this invention will be explained in greater detail, using several preferred embodiments. For the sake of the convenience explanation will be made, referring to the drawing, in which attention should be paid to the fact that principal parts are indicated in an enlarged scale. Further, although the material of various parts, the conductivity type of semiconductor layers and the conditions of fabrication will be prescribed in the following description for the purpose of making explanation clearer, it is a matter of course that they are not restricted to those described.

At first an embodiment of this invention concerning the buried diffusion layer in a bipolar transistor will be explained.

EMBODIMENT 1

FIGS. 1 to 5 are cross-sectional views illustrating a first embodiment of the semiconductor device according to this invention in the order of the fabrication steps.

In FIG. 1, phosphor (P) ions are selectively implanted in a desired region on a p conductivity type silicon (Si) substrate 1 having a resistivity of 10 Ω—cm, whose principal surface is (111). Then an $n^-$ conductivity type diffusion layer 2 having a surface impurity concentration of $1 \times 10^{15}$ cm$^{-3}$ and a junction depth of 0.8 μm is formed by subjecting the substrate 1 to a heat treatment. Eventually the $n^-$ conductivity type diffusion layer 2 may be formed over the whole surface of the substrate 1. After that, a silicon dioxide layer (hereinbelow called SiO$_2$ layer) 3, 50 nm thick by the thermal oxidation method, a silicon nitride layer (hereinbelow called Si$_3$N$_4$ layer) 4, 120 nm thick by the chemical vapor deposition (hereinbelow abbreviated to CVD) method and an SiO$_2$ layer 5 by the CVD method are formed one after another on the Si substrate 1. Thereafter, the three-layered insulating layer consisting of the SiO$_2$ layer 5, the Si$_3$N$_4$ layer 4 and the SiO$_2$ layer 3 is patterned by reactive ion etching (hereinbelow abbreviated to RIE) and further the Si substrate 1 is etched also to a depth of 0.6 μm, using the three-layered insulating layer described above as a mask. Subsequently the Si surface thus exposed is etched to a depth of 0.1 μm by using a mixed solution of nitric acid (HNO$_3$) and fluoric acid (HF). Then, after having formed a two-layered insulating layer 6 over the whole surface by superposing an SiO$_2$ film 50 nm thick formed by the thermal oxidation method and an Si$_3$N$_4$ 120 nm thick formed by the CVD method on each other, an etching by the RIE method proceeds only in the direction perpendicular to the principal surface of the Si substrate 1 so that the two-layered insulating layer 6 remains only on the side wall portion of the three-layered insulating layer 3 to 5 and the Si substrate 1.

Figure 2:
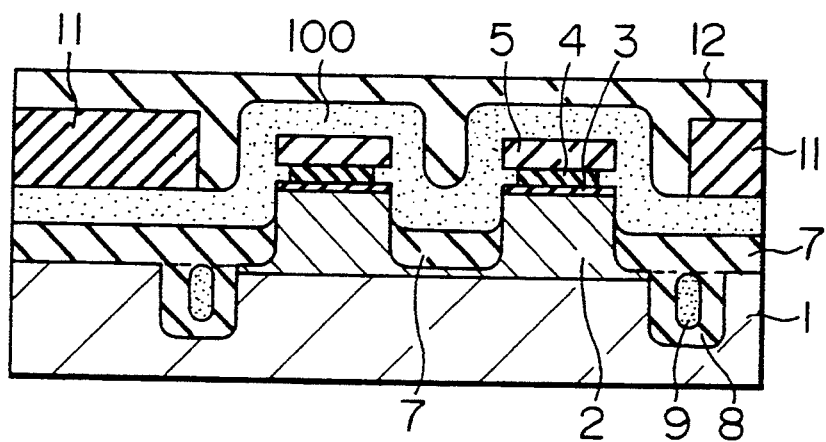

Starting from the state indicated in FIG. 1, an SiO$_2$ layer 450 nm thick is formed by wet thermal oxidation on the exposed surface of the Si substrate 1 by using the two-layered insulating layer 6 as a mask, which SiO$_2$ layer serves as an isolating insulating layer 7, as indicated in FIG. 2. Then the isolating insulating layer is patterned so as to form a trench 1 μm wide, which encloses an active region, and a trench 2.5 μm deep is formed also on the Si substrate 1 by the RIE method with the same pattern. After having etched off the surface portion 0.1 μm thick within the Si deep trench described previously by using a mixed solution of fluoric acid and nitric acid, boron (B) ions are implanted under a condition that the acceleration energy is 50 keV and the dose is $3 \times 10^{13}$ cm$^{-2}$, in order to prevent the channel formation, and a channel step layer (not shown in the figure) is formed at the bottom portion of the deep trench by a succeeding activation heat treatment. Thereafter, an SiO$_2$ layer 0.2 μm thick is formed on the surface of the Si deep trench by the wet thermal oxidation, which SiO$_2$ layer serves as a deep trench insulating layer 8 for isolating elements. Then, after having deposited a polycrystalline (or amorphous) Si layer 0.7 μm so as to fill the deep trench, etching process is performed isotropically by microwave plasma etching so that a polycrystalline Si layer 9 is selectively left only in the deep trench. After that, the surface of the polycrystalline Si layer 9 selectively left is oxidized by the wet thermal oxidation so as to form an SiO$_2$ layer 0.45 μm thick. Then the two-layered insulating layer 6 is removed by using a phosphoric acid solution heated to 180° C. so as to expose the side wall of the Si substrate 1 in the active region. At this time the Si$_3$N$_4$ layer 4 is also side-etched. Then a polycrystalline Si layer 100 0.7 μm thick is deposited over the tunnel surface by the CVD method and a thermal oxidation layer (not shown in the figure) 20 nm thick is formed at the surface portion thereof. Finally a photoresist film 11 is selectively left at places, where the interval between adjacent two protruding regions on the substrate is grater than 1 μm and another photoresist film 12 1 μm thick is applied over the whole surface to flatten the surface.

Figure 3:
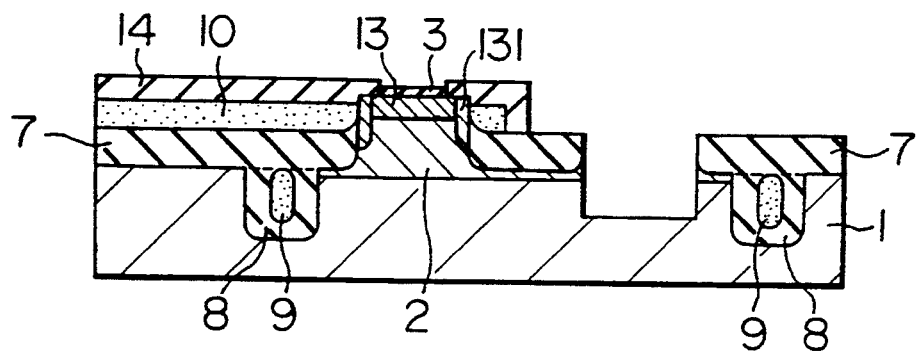

Starting from the state indicated in FIG. 2, the photoresist layers 12 and 11 are etched by the RIE method to flatten the surface and to expose the polycrystalline Si layer 100 in the protruding regions, as indicated in FIG. 3, and the SiO$_2$ layer formed on the surface is removed. Subsequently the polycrystalline Si layer 100 on the upper surface of the protruding regions and the upper port of the side wall is removed isotropically by the microwave etching so as to expose the surface of the SiO$_2$ layer. After having removed the photoresist films 11 and 12, boron ions are implanted in the polycrystalline Si layer 100 left in the recessed portion of the Si substrate under a condition that the acceleration energy is 30 keV and the dose is $1 \times 10^{16}$ cm$^{-2}$ and the SiO$_2$ layer on the polycrystalline si layer 100 and the SiO$_2$ layer 5 on the protruding portion are removed. Then the polycrystalline Si layer 100 is patterned and a base taking-out electrode 10 is formed. In this way a p+ conductivity type external base diffusion region 131 is formed by subjecting the whole to a heat treatment. Subsequently, after having formed a protecting insulating layer 14 250 nm thick by oxidizing the base taking-out electrode by the wet thermal oxidation, the $Si_3N_4$ layer 4 is removed and a p− conductivity type intrinsic base diffusion layer 13 is formed by boron ion implantation through the $SiO_2$ layer 3 (implantation energy: 10 key and dose: $1 \times 10^{14}$ cm$^{-2}$) and an activation thermal treatment thereof. Then a vertical tunnel is formed on the Si substrate 1 by removal of the $SiO_2$ layer 3 on the region, where a collector taking-out electrode is to be formed, and by the RIE method. The depth of the vertical tunnel is 0.5 μm, measured from the lower end of the isolating insulating layer 7, and about 1.4 μm, measured from the principal surface.

Figure 4:
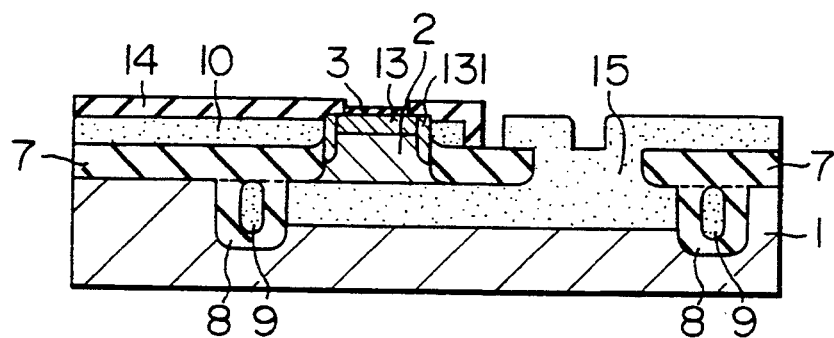

Starting from the state indicated in FIG. 3, a lateral tunnel is formed, as indicated in FIG. 4, by a treatment about 120 minutes long using an etching solution, in which 80% hydrated hydrazine ($N_2H_4$), isopropanol and a solution containing appropriate surface active agent at a concentration of about 1% are mixed with a ratio of 200:20:1, at a temperature of 60° C. The etching region is an active region enclosed by the deep trench insulating layer 8 and the lateral tunnel is about 5 μm deep in the direction of the axis <011>. In the etching stated above no proceeding of the etching is found at all in the direction of the axis <111>, which is perpendicular to the principal surface. The height of the lateral tunnel is 0.5 μm and a bottom and a ceiling surface, which are parallel to the principal surface, are formed. Further the etching stated above is not necessarily effected by using a hydrazine aqueous solution, but it may be effected by using a potassium hydroxide (KOH) aqueous solution or on the basis of the anisotropic gaseous phase dry etching method, etc. At the formation of the lateral tunnel the regions covered by the $SiO_2$ layers 3, 7, 8 and 14 are not etched at all. After the formation of the lateral tunnel a polycrystalline Si layer 1 μm thick doped with phosphor (P) is deposited so as to fill the lateral and vertical tunnels and patterned to form a collector taking-out electrode 15.

Figure 5:
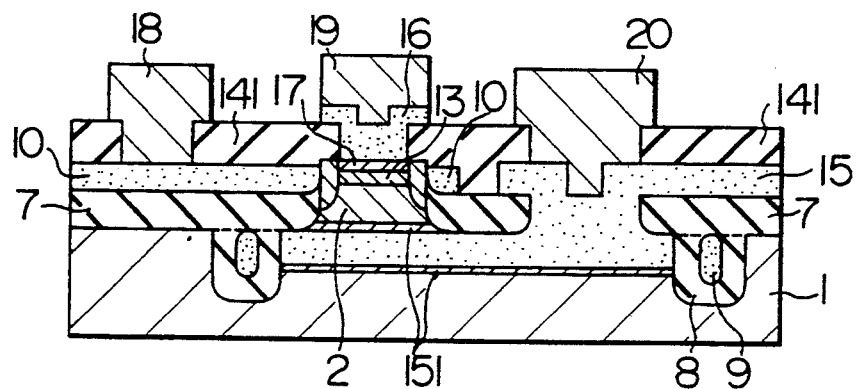

Next, as indicated in FIG. 5, a thin $SiO_2$ layer (not shown in the figure) is formed on the collector taking-out electrode by thermal oxidation and at the same time an n+ conductivity type collector diffusion layer 151 is formed by solid phase diffusion from the buried region. Then, after having selectively removed the $SiO_2$ layer 3 on the region, where the emitter is to be formed, a polycrystalline Si layer 16 0.25 μm thick is deposited over the whole surface by the CVD method and an n+ conductivity type emitter diffusion layer 17 is formed by implantation of As ions under a condition that the acceleration energy is 80 keV and the dose is $2 \times 10^{16}$ cm$^{-2}$ and a succeeding heat treatment. Thereafter an emitter taking-out electrode 16 is formed by patterning the polycrystalline Si layer 3 and an $SiO_2$ layer is deposited over the whole surface by the CVD method, which layer serves as a surface passivation layer 141, in which contact holes are formed at desired positions. Finally a metal film, whose principal component is Al, is deposited by evaporation and patterned according to a desired circuit construction so as to form electrodes and wiring, including a base electrode 18, an emitter electrode 19 and a collector electrode.

Through the fabrication steps described above a vertical type npn transistor, which is the semiconductor device, object of this embodiment, is fabricated. According to this invention no step for epitaxial growth is necessary and no problem of positional deviations from the collector buried layer is produced. Further a large number of products can be treated simultaneously and therefore they can be fabricated at a low cost. In addition, since the collector buried diffusion layer can be formed after the step for the formation of the base diffusion layer 13, the high temperature heat treatment step, to which the collector buried diffusion layer 151 is subjected, is shortened and it is possible to obtain a collector buried diffusion layer 151 keeping an extremely abrupt impurity distribution, for which a redistributed diffusion width is as small as 0.1 μm. Furthermore, since the polycrystalline buried Si layer 7 can be doped with P as impurity, even if it is constructed so as to be as thin as 0.5 μm, it can have a sheet resistance of 30 Ω☐ which is equal to that obtained for a conventional buried diffusion layer 152 doped with Sb and 1.5 μm thick. Thus it is possible to reduce remarkable the collector resistance. The buried polycrystalline Si layer described above acts as the collector taking-out electrode. Therefore, since the area of region necessary for the prior art collector connecting diffusion layer 153 can be significantly reduced and the freedom for the collector wiring is increased, decrease in the element occupation area and increase in the degree of integration are made possible.

FIGS. 6 to 9 are cross-sectional views illustrating another embodiment of this invention in the order of the fabrication steps.

Figure 6:
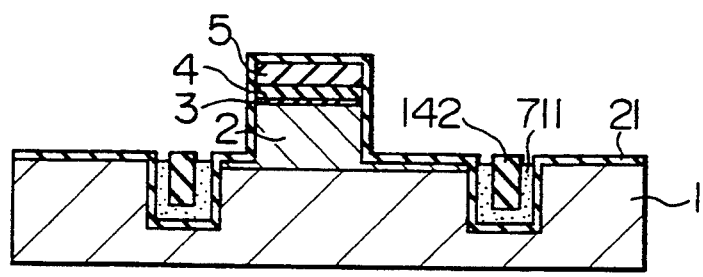
FIGS. 6 to 9 are cross-sectional views illustrating a second embodiment of this invention in the order of the fabrication steps.

At first, as indicated in FIG. 6, after having etched the Si substrate 1 in the vertical direction at a depth of 0.5 μm by the RIE method using the three-layered insulating layer 4 to 5 as a mask in EMBODIMENT 1, a trench 0.8 μm wide and 2.5 μm deep is formed in the Si substrate 1 so as to enclose the active region. Then an $SiO_2$ layer 15 nm thick formed by the thermal oxidation method and an $Si_3N_4$ layer 30 nm thick formed by the CVD method are superposed on each other on the exposed Si substrate 1 to form a two-layered insulating layer 21. Further a polycrystalline (or amorphous) Si layer 711 0.15 μm thick is deposited thereon and selectively left in the deep trench. This selective leaving is effected by etching the polycrystalline Si layer 711 by microwave etching after having applied a photoresist resin film 142 so as to flatten the surface and left the photoresist resin film 142 only in the free space of the deep trench by sputter etching.

Figure 7:
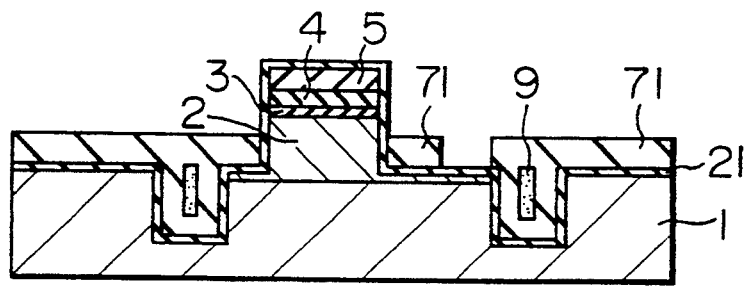

Starting from the state indicated in FIG. 6, after having removed the photoresist resin film 142, the polycrystalline Si layer 711 is transformed into an $SiO_2$ layer 0.3 μm thick by the wet thermal oxidation to form an element isolating deep trench insulating layer. Thereafter, as indicated in FIG. 7, a polycrystalline Si layer 9 is again deposited at a thickness of 0.2 μm so as to fill the free space in the deep trench. Then the polycrystalline Si layer 0.2 μm thick on the upper portion of the protruding portion and the side wall of the Si substrate is selectively removed by the flattening technique described above. After that, the polycrystalline Si layer 0.2 μm thick stated above is patterned into a desired shape and transformed completely into an $SiO_2$ layer by the wet thermal oxidation except for the deep trench filling portion to form an isolating insulating layer 71 0.4 μm thick. At this time the Si substrate 1 is covered by a two-layered insulating layer 21 and therefore it is not oxidized in the wet thermal oxidation step.

Figure 8:
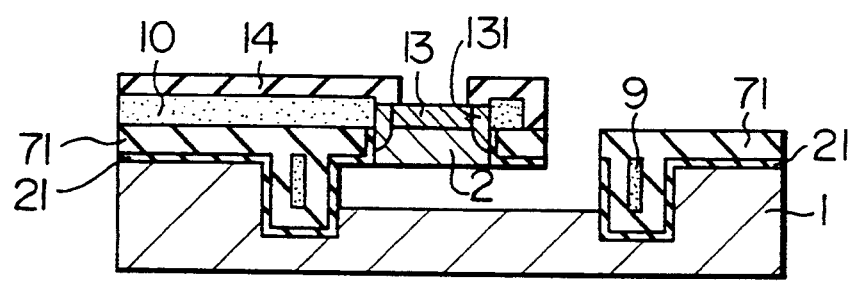

Next, as indicated in FIG. 8, after having selectively removed the two-layered insulating layer 21 in the region, where the base is to be taken-out, a base taking-out electrode 10, a p+ conductivity type external base region 131, a protecting insulating layer 14 and an intrinsic base region 13 are formed one after another according to the same process as that described in EMBODIMENT 1. Then, after having removed the two-layered insulating layer in the region, where the collector is to be taken-out, the exposed Si substrate is etched at a depth of 1 μm by the microwave etching method and then a lateral tunnel reaching the deep trench insulating layer is formed by using an $N_2H_4$ mixed solution according to the process described in EMBODIMENT 1. Thereafter the $SiO_2$ layer 3 on the region, where the emitter is to be formed, is removed.

Figure 9:
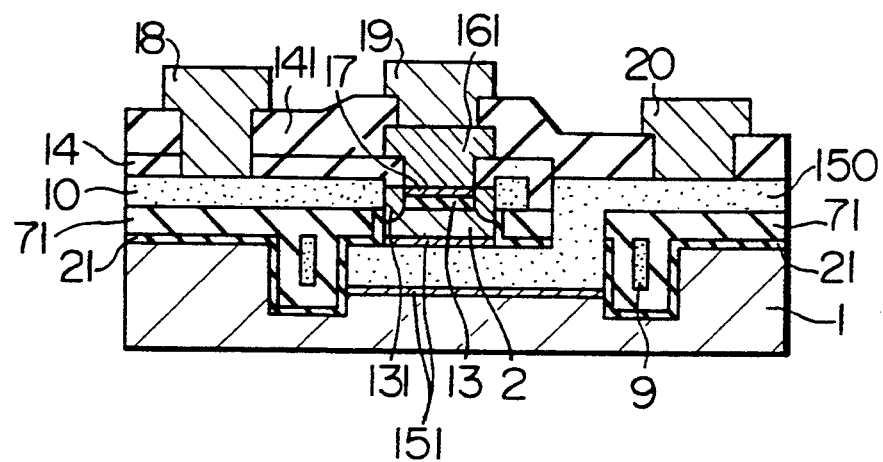

Finally, as indicated in FIG. 9, a polycrystalline (or amorphous) Si layer doped with As at a high concentration is deposited so as to fill the vertical and the lateral tunnels and an n+ conductivity type buried collector diffusion layer 151 and an n+ conductivity type emitter diffusion layer 17 are formed by a succeeding activation thermal treatment. Then the polycrystalline Si layer used as a solid phase diffusion source for the n+ conductivity type diffusion layer is patterned to form a collector taking-out electrode 150 and an emitter taking-out electrode 161. Further, a surface passivation layer 141, a base electrode 18, an emitter electrode 19 and a collector electrode 20 are formed according to the process described in EMBODIMENT 1.

Through the fabrication steps described above a vertical type npn transistor, object of this embodiment, is fabricated. According to this embodiment, besides the effects described in EMBODIMENT 1, another effect can be obtained that it is possible to realize an abrupt impurity concentration distribution and to reduce further the thickness of the n− conductivity type diffusion layer 2, because the emitter diffusion layer 17 and the collector buried diffusion layer 151 can be simultaneously formed. Consequently an operation speed, which is still higher than that obtained by the vertical npn transistor based on EMBODIMENT 1, can be obtained. Further according to this embodiment, since the emitter taking-out electrode 161 and the collector taking-out electrode 150 can be formed in a same step, this embodiment has an effect to decrease the number of fabrication steps. Furthermore, according to this invention, since the microwave etching method is used for the formation of the vertical tunnel in the collector taking-out region, it is possible to form the vertical tunnel matched with the isolating insulating layer 71 and the deep trench insulating layer and to reduce further the element occupation area with respect to that required in EMBODIMENT 1. Further, although vertical type npn transistors have been indicated as examples in EMBODIMENT 1 and this EMBODIMENT, it is a matter of course that this invention can be applied also to a lateral type pnp transistor, in which the emitter diffusion layer 17, the emitter taking-out electrode 161, the emitter electrode 19, and the intrinsic base region 13 are not constructed, but external base regions 131 are disposed, opposite to their position, they being used as the p+ emitter and the p+ collector, the n+ conductivity type buried diffusion layer 151 acting as the base and 150 as the base taking-out electrode.

EMBODIMENT 3

Figure 10:
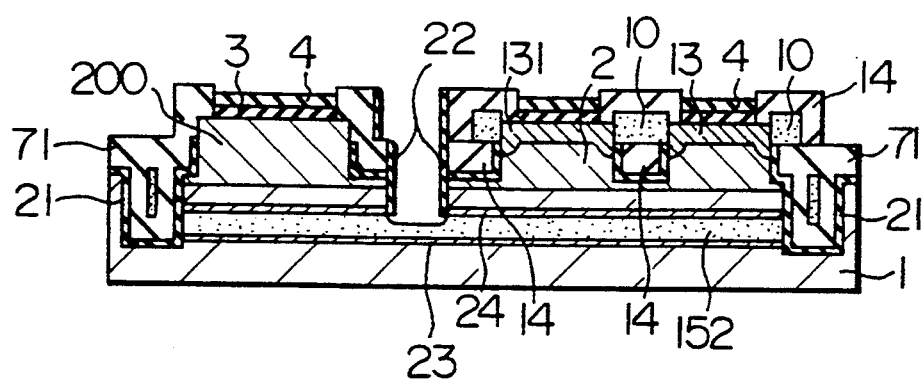
FIGS. 10 to 12 are cross-sectional views illustrating a third embodiment of this invention in the order of the fabrication steps.
Figure 11:
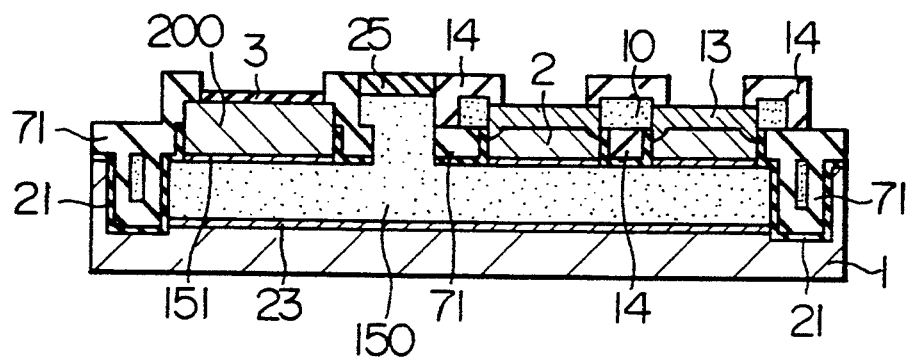
Figure 12:
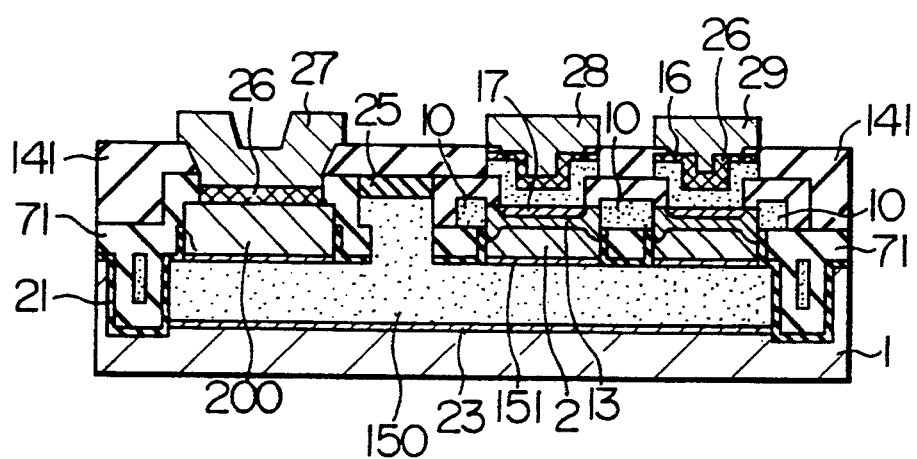

FIGS. 10 to 12 are cross-sectional views of still another embodiment of this invention in the order of the fabrication steps. Instead of the n− conductivity type diffusion layer 2 in EMBODIMENT 2 described above, an n− conductivity type diffusion layer 200 is formed in a region, where a Schottky barrier is to be formed, under a different ion implantation condition. The ion implantation is effected under a condition that the acceleration energy is 160 keV and the dose is $2 \times 10^{13}$ cm$^{-2}$. After that, the Si substrate 1 is etched in the collector taking-out region at a depth of 0.3 μm according to the process described in EMBODIMENT 2. Subsequently by depositing an $Si_3N_4$ layer 22 250 nm thick over the tunnel surface and etching it in the vertical direction by the RIE method, the $Si_3N_4$ layer 22 is selectively left only on the side wall of the protruding portion. The $Si_3N_4$ layer 22 selectively left on the side wall may be replaced by an $SiO_2$ layer having a same thickness. After that, the exposed Si substrate 1 is etched again by the RIE method at a depth of 0.3 μm and then a lateral tunnel reaching the deep trench insulating layer is formed according to the process described in EMBODIMENT 2. Thereafter $SiO_2$ layers 23 and 24 of 0.2 μm thick are formed at the bottom portion and the ceiling surface of the lateral tunnel by the high temperature wet thermal oxidation method (4 at., 1000° C.). Then the lateral tunnel is filled with a polycrystalline Si layer 152 doped with P at a high concentration. The polycrystalline Si layer 152 in the vertical tunnel is selectively removed by the microwave etching method (FIG. 10).

Starting from the state indicated in FIG. 10, after having formed a thin $SiO_2$ layer (not shown in the figure) on the surface of the exposed polycrystalline Si layer 152 by the thermal oxidation method, the $Si_3N_4$ layer 22 is selectively removed so as to expose the side surface of the Si substrate. Subsequently, as indicated in FIG. 11, a lateral tunnel is formed by using again an $N_2H_4$ solution to expose the $SiO_2$ layer 24. The lateral and the vertical tunnels are filled by removing the $SiO_2$ layer 24 and depositing a polycrystalline Si layer 150 doped with As at a high concentration. Next the polycrystalline Si layer on the principal surface is removed by the microwave etching to flatten the surface and the polycrystalline Si layer 150 exposed at the surface of the vertical tunnel is subjected to wet thermal oxidation to form a thick $SiO_2$ layer 25. Thereafter the $Si_3N_4$ layer 4 is removed and the $SiO_2$ layer 3 on the regions, where the Schottky barrier diode and the emitter are to be formed, is selectively removed.

Starting from the state indicated in FIG. 11, after having formed an n+ conductivity type emitter diffusion layer 17, an emitter taking-out electrode 16 and a surface passivation layer 141, throughholes are formed in desired positions of the surface passivation layer 141 and a Pt layer 25 nm thick is deposited thereon by evaporation. Then the Pt layer is heated in an oxygen atmosphere to a temperature of 475° C. to form a platinum silicide (designated as PtSi) layer 26 by reactions on the surface of the n− conductivity type diffusion layer 200 and the n+ conductivity type emitter taking-out electrode 16. Pt doesn't react on $SiO_2$ under the thermal treatment conditions described above. After the formation of the PtSi layer 26, when Pt which has not reacted is removed by using acqua regina, the PtSi layer 27 is selectively left only on the Si substrate 200 and the polycrystalline Si layer (emitter taking-out electrode) 16. After the formation of the PtSi layer 27 a two-layered metal film consisting of a TiN layer 0.1 μm thick formed by the sputtering method and a metal evaporation layer 0.8 μm thick, whose principal component is Al, is deposited thereon and electrodes and wiring including upper side word lines 27, digit lines 28 and lower side word lines 29 are formed according to a desired circuit construction.

Figure 13:
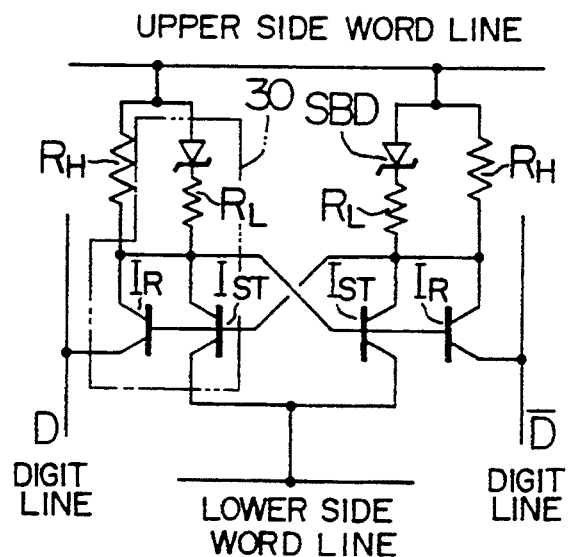
FIG. 13 is an equivalent circuit diagram of a semiconductor device obtained according to the third embodiment.

Through the fabrication steps described above a bipolar memory, which is the semiconductor device of this embodiment, is fabricated. The cross-sectional view indicated in FIG. 12 corresponds to the cross-section of the element component enclosed by a broken line 30 in the bipolar memory cell indicated in FIG. 13, in which active elements, which are a Schottky barrier type diode (designated as SBD), an npn vertical type transistor for reading-out (designated as Ir) and an npn vertical type transistor for storing (designated as Ist), an upper word line 27, a digit line (designated as D) 28 and a lower word line 29 are indicated. The buried collector semiconductor layer 150 is connected with the base taking-out electrodes of a pair of transistors constituting a flip-flop circuit in another region. Similarly the base taking-out electrodes 10 are connected with the collector taking-out electrode of the pair of transistors constituting the flip-flop circuit.

On the basis of this embodiment, besides the effects concerning the single elements in EMBODIMENT 2 described above, an effect can be obtained that the problem of the interference between memory cells and misoperation due to α-ray soft errors are solved completely by disposing the buried insulating layer ($SiO_2$ layer) 23. Consequently, since constituent elements indispensable for a measure against α-ray soft errors in conventional memory cells, such as capacitive elements connected between memory storage nodes and the upper side power source lines become unnecessary, etc., it becomes possible to realize superfine memory cells and a super high degree of integration. Further, although in this embodiment an example, in which a polycrystalline Si layer is used as the buried collector taking-out electrode 150, has been explained, it may be also a two-layered film consisting of a polycrystalline Si layer and a metal layer or a metal layer further or another semiconductor layer having a different band gap. Furthermore the $SiO_2$ layer 23 is not necessarily restricted to an $SiO_2$ layer formed by thermal oxidation, but it may be an $SiO_2$ layer formed by the CVD method, the plasma deposition method, etc. or an insulating layer made of another material such as phosphosilicate glass, borosilicate glass, $Al_2O_3$, $Ta_2O_5$, $Ti_2O_5$, $Si_3N_4$, etc.

As it is clear from the explanation in EMBODIMENTS 1, 2 and 3 described above, according to this invention, no epitaxial step is necessary and all the problems of positional deviations from the collector buried layer, treatment of a small number of product steps, rising of the collector impurity and a high collector resistance are solved. Thus it is possible to obtain a superfine transistor having a collector with an abrupt impurity distribution and a low resistance (which is one third as low as that obtained by the prior art technique) at a low cost. Furthermore, according to this invention, since the collector connection can be constructed by using a polycrystalline semiconductor layer, effects to reduce the collector occupation area and to increase the freedom in the collector wiring can be obtained.

In addition, according to this invention, since it is possible to dispose an insulating layer at the lower part of the buried collector region, effects can be obtained that the constituent elements of the memory cells are more completely isolated from the semiconductor substrate and that the problems of the interference between adjacent cells and the α-ray soft errors are completely solved. Consequently addition of extra capacitive elements to the memory cells becomes unnecessary and an effect to obtain hyperfine memory cells is obtained.

Now an embodiment of this invention concerning a DRAM consisting of a transistor and a capacitive element will be explained.

EMBODIMENT 4

FIGS. 14A to 18B are cross-sectional views of a semiconductor memory device, which is a fourth embodiment of this invention, in the order of the fabrication steps, in which the figures, whose number ends by A and the figures, whose number ends by B refer to cross-sectional views, which are perpendicular to each other, the former representing a $(\overline{2}11)$ plane and the latter a $(\overline{0}11)$ plane.

Figure 14A:
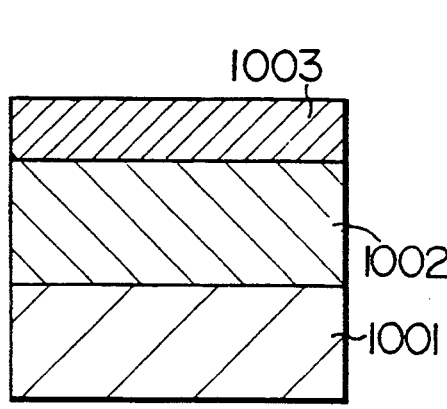
Figure 14B:
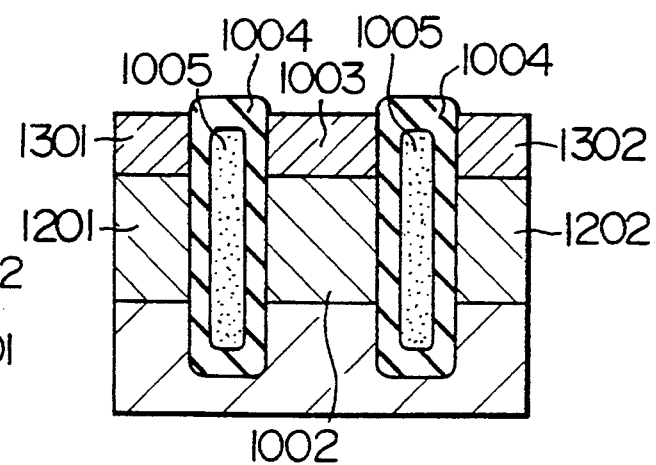

In FIGS. 14A and 14B an n+ conductivity type buried layer 1002 having a depth of 1.5 μm and an impurity concentration of $3 \times 10^{19}$ cm$^{-2}$ is selectively formed by the well-known thermal diffusion method in the surface portion of a p conductivity type silicon (Si) substrate 1 having a resistivity of 10 Ωcm, whose principal surface is (111). Then an epitaxial layer 1003 0.98 μm thick is grown over the whole surface. Thereafter $SiO_2$ layer 50 nm thick formed by thermal oxidation, an $Si_3N_4$ layer 120 nm thick formed by the chemical vapor deposition (designated as CVD) method and a deposited $SiO_2$ layer 1 μm thick (none of them is indicated in the figure) are deposited one after another on the surface of the epitaxial layer 1003 and holes are formed at desired positions.

The epitaxial layer 1003 and the n+ conductivity type buried layer 1002 at the opened positions are processed by reactive ion etching using the two-layered insulating layer as an etching mask to form tunnels (depth 3 μm, area of each tunnel $1 \times 1$ μm$^2$) reaching the Si substrate 1. Thereafter an $SiO_2$ layer 1004 0.3 μm thick is formed at the side wall and the bottom of each of the tunnels by the thermal oxidation method, which tunnel is filled with a polycrystalline (or amorphous) si layer 1005. At the filling stated above, although the polycrystalline Si layer is formed also on the two-layered insulating layer described above, the polycrystalline Si layer on the two-layered insulating layer is selectively removed by reactive ion etching so as to leave the polycrystalline Si layer 5 only in the tunnels.

From this state the deposited $SiO_2$ layer in the two-layered insulating layer is removed by using the polycrystalline Si layer 1004 as an etching mask to expose the $Si_3N_4$ layer and a thermal oxidation layer (0.4 μm thick) is formed selectively on the exposed polycrystalline Si layer 5 by using the $Si_3N_4$ layer as an oxidation mask. From this state the $Si_3N_4$ layer and the thin $SiO_2$ layer constituting a two-layered insulating layer are selectively removed to expose the surface of the epitaxial layer 1003 (FIGS. 14A and 14B). At this time the Si opening portion constituting the $SiO_2$ layer 1004 and the polycrystalline Si layer 1005 may be stripe-shaped.

From the sate indicated in FIGS. 14A and 14B, after having formed again a three-layered insulating layer consisting of an $SiO_2$ layer 1003 50 nm thick formed by thermal oxidation, a deposited $Si_3N_4$ layer 1007 120 nm thick and a deposited SiO$_2$ layer 1008 0.8 μm thick over the whole surface of the epitaxial layer 1003, a part of the three-layered insulating layer 1006 to 1008 is patterned so as to be superposed on the SiO$_2$ layer 1004 at the Si opening portion. What the three-layered insulating layer 1006 to 1008 constructed by the patterning is to the Si opening SiO$_2$ layer 1004, the bridge board is to the bridge pier. Then the epitaxial layer is etched in the vertical direction at a depth of 0.3 μm by using the patterned three-layered insulating layer 1006 to 1008 as a mask. The patterning of the three-layered insulating layer 1006 to 1008 and the etching of the epitaxial layer 1003 are effected by the reactive ion etching method.

After the vertical etching of the epitaxial layer 1003 an SiO$_2$ layer 30 nm thick by the thermal oxidation is formed over the whole surface of the exposed epitaxial layer 3 and then an Si$_3$N$_4$ layer 1009 120 nm thick is deposited over the whole surface. Thereafter the deposited Si$_3$N$_4$ layer is etched only in the direction perpendicular to the principal surface of the Si substrate by the reactive ion etching method so as to leave the deposited Si$_3$N$_4$ layer 1009 only on the side wall of the three-layered insulating layer 1006 to 1008 and on the side wall of the epitaxial layer 1003 (FIGS. 15A and 15B).

Figure 15A:
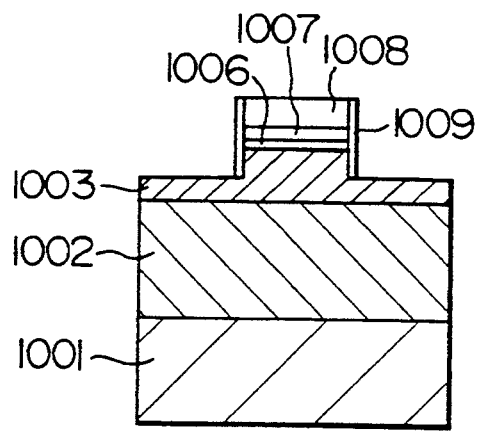
Figure 15B:
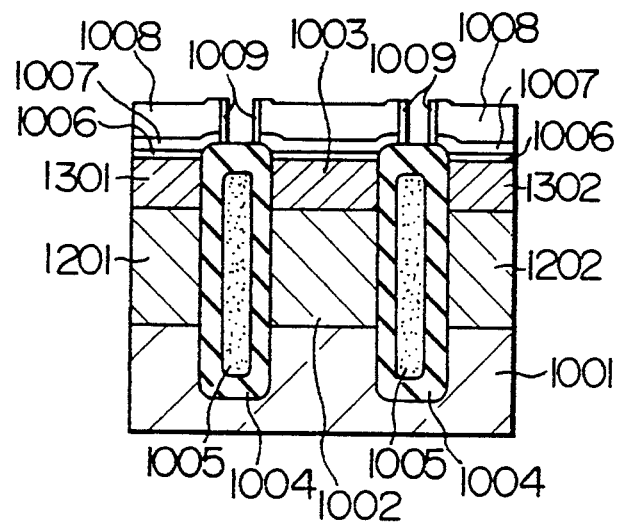

From the state indicated in FIGS. 15A and 15B the epitaxial layer 1003 and the n+ conductivity type buried diffusion layer 1002 are etched in the vertical direction by using the three-layered insulating layer 1006 to 1008 and the Si opening SiO$_2$ layer 1004 as an etching mask. The depth of the etching is 2.2 μm measured from the surface of the epitaxial layer 1003. From this state, after having deposited an Si$_3$N$_4$ layer 10 30 nm thick over the whole surface, etching is effected again on the surface of the epitaxial layer 1003 and in the vertical direction so as to leave selectively the Si$_3$N$_4$ layer only on the side surface of Si. Further vertical etching is effected again on the Si substrate 1001 at a depth of 0.3 μm (FIGS. 16A and 16B).

Figure 16A:
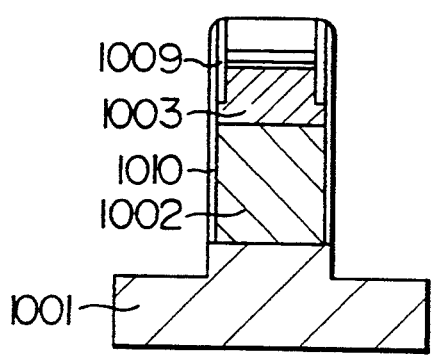
Figure 16B:
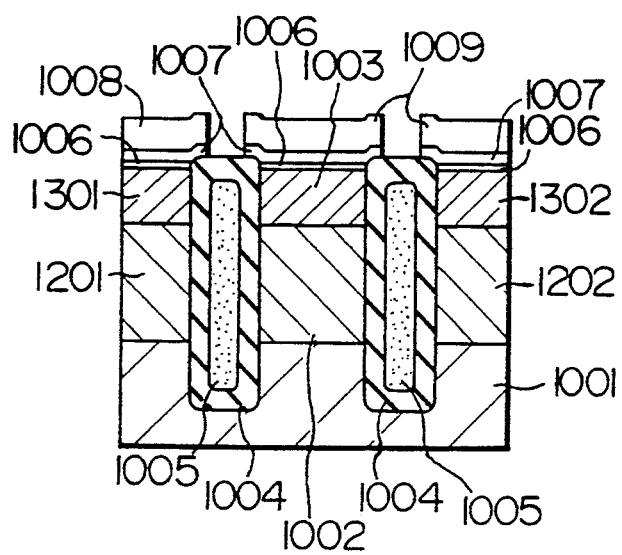

In the sate indicated in FIGS. 16A and 16B treatment is effected in about 1 hour by using an etching solution, in which 80% hydrated hydrazine, isopropanol and a solution containing appropriate surface active agent at a concentration of about 1% are mixed with a ratio of 200:20:1 at a temperature of 60° C. Under the etching conditions described above the Si etching speed in the direction of <110> is about 120 nm/min, while that of <111> is negligibly small. Further neither the SiO$_2$ layer 1004 nor the Si$_3$N$_4$ layer 1010 are etched at all.

In FIGS. 16A and 16B, the cross-sectional view indicated in FIG. 16A represents a ($\bar{2}$11) plane and that indicated in FIG. 16B a ($\bar{0}$11) plane. The etching described above proceeds only in the direction parallel to the sheet in FIG. 16A and in the directions perpendicular to the sheet in FIG. 16B (directions of (01$\bar{1}$) and (0$\bar{1}$1) and it doesn't in the directions of (111) and (1$\bar{1}$1), which are perpendicular to the surface of the epitaxial layer 1003. Consequently in FIG. 16B a structure can be realized, in which the Si singlecrystal region, which is the upper portion above the n+ conductivity type buried diffusion layer 1002, is isolated from the Si substrate 1001 in the state where it is supported by the SiO$_2$ layer 1004 at the Si opening portion.

Furthermore it is not necessary that the etching is effected by using any hydrazine solution, but it may be based e.g. on an anisotropic etching solution such as a hydroxide potassium (KOH) aqueous solution, the gaseous dry etching method, etc.

After having isolated the Si singlecrystal region from the substrate by the anisotropic etching in the direction parallel to the Si (111) plane using the hydrazine solution, the Si$_3$N$_4$ layer 1010 is removed by using a hot phosphoric acid (heated at 160° C.). The removal described above may be effected by the microwave dry etching method.

Next thermal oxidation SiO$_2$ layers 1011, 1110, 1112 and 1111 are formed 15 nm thick on the side wall and the bottom portion of the n+ conductivity type buried diffusion layer 2 thus exposed. Then a polycrystalline (or amorphous) Si layer 1012 doped with phosphor is deposited over the whole surface by the gaseous phase chemical reaction using disilane or monosilane, to which phosphine (PH$_3$) is added. The gaseous phase chemical reaction stated above may be effected by using monosilane (SiH$_4$), etc. and the doping with phosphor may be based on the thermal diffusion method.

After the deposition of the polycrystalline Si layer 1012, after having coating a photoresist film (not shown in the figure) to the whole surface, the photoresist film stated above is subjected to a whole surface dry etching. The polycrystalline Si layer 1012 or the three-layered insulating layer 1006 to 1008 constituting the protruding portion is exposed and removed at first by microwave dry etching and then the remaining photoresist film is removed. Subsequently the polycrystalline Si layer 1012 is etched by the microwave dry etching to form a plate electrode. The amount of the etching stated above is controlled under a condition that a polycrystalline Si layer on a dummy substrate having same difference in level as that indicated in FIGS. 15A and 15B is removed completely. After the etching stated above the surface of the exposed polycrystalline Si layer 1012 is subjected to the wet thermal oxidation to form a first isolating insulating layer 13, which is an SiO$_2$ layer 0.4 μm thick (FIGS. 17A and 17B).

Figure 17A:
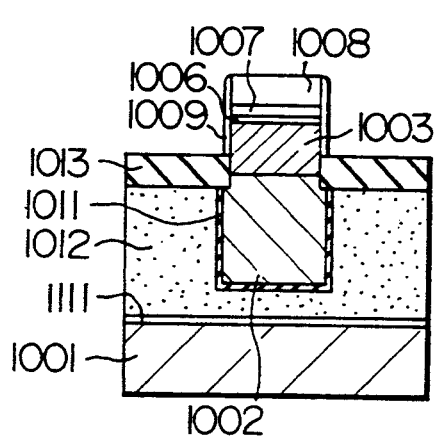
Figure 17B:
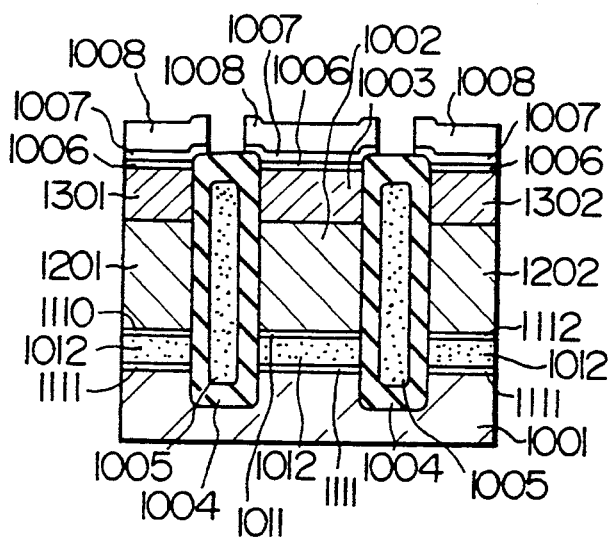

From the state indicated in FIGS. 17A and 17B the Si$_3$N$_4$ layer 1009 is removed by using phosphoric acid and a polycrystalline (or amorphous) Si layer 1014 is again deposited thereon. After having implanted boron (B) ions under a condition that the dose is $1 \times 10^{16}$ cm$^{-2}$ and the acceleration energy is 30 keV, an activation heat treatment is effected to form a p+ conductivity type graft base. Then the polycrystalline Si layer 1014 on the first isolating insulating layer 1013 is patterned according to a desired construction to form word lines 1014. Although the patterning has been effected by using reactive ion etching, the polycrystalline Si layer 1014 is also left on the side wall portion of the three layered insulating layer 1006 to 1008 regardless of the pattern stated above and a state can be obtained, where the patterned polycrystalline Si layer is connected with the polycrystalline Si layer on the side wall. At the patterning described above, the polycrystalline Si layer 1014 is left on the three-layered insulating layer 1006 to 1008. After the patterning described above a photoresist film is formed and left on a region, where a recessed portion exists over 1 μm, and a photoresist film 1 μm thick is applied to the remaining recessed portion so as to flatten the surface. From this state each of the photoresist films (not shown in the figure) is uniformly dry-etched so as to expose the surface of the polycrystalline si layer 1014 on the three-layered insulating layer 1006 to 1007, which is selectively removed by the microwave dry etching. Subsequently, after having removed the SiO$_2$ layer 1008 in the three-layered insulating layer by using a fluoric acid aqueous solution, the photoresist film is removed.

From this state an inter layer insulating layer 1020 0.3 μm thick is formed by wet-oxidized the polycrystalline Si layer 1014 used as word line. At this time the Si₃N₄ layer 1007 acts as a mask preventing the oxidation stated above (FIGS. 18A and 18B).

Figure 18A:
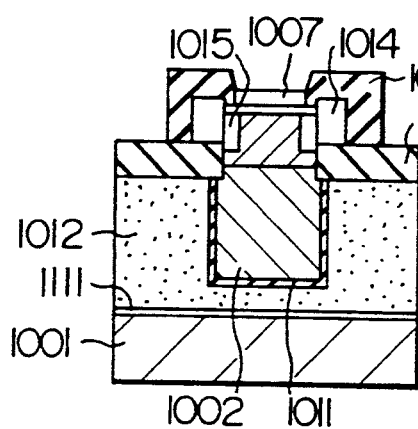
Figure 18B:
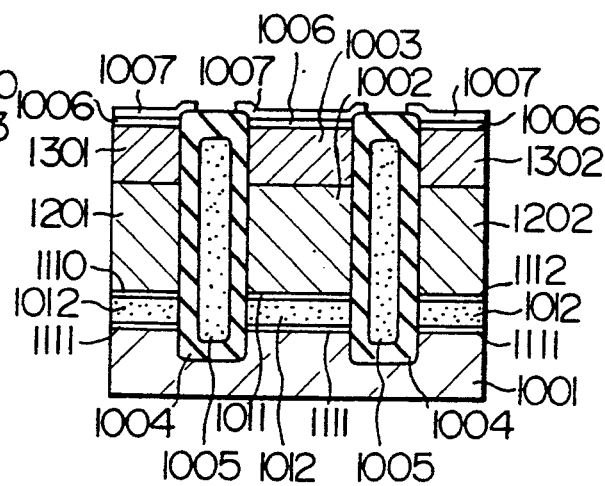

From the state indicated in FIGS. 18A and 18B, after having removed the exposed Si₃N₄ layer 1007 by using a hot phosphoric acid solution, boron ions are implanted under a condition that the acceleration energy is 10 keV and the dose is $1 \times 10^{14}$ cm$^{-2}$ and an intrinsic base region 1017 is formed by effecting an activation heat treatment at 900° C. Then, after having removed selectively the SiO₂ layer 1006 so that the principal surface of the Si substrate is exposed, a polycrystalline (or amorphous) Si layer 1018 is again deposited and arsenic ions are implanted under a condition that the acceleration energy is 80 keV and the dose is $2 \times 10^{16}$ cm$^{-2}$. Subsequently an emitter region 1019 is formed by effecting an activation heat treatment at 950° C. Thereafter, after having patterned the polycrystalline Si layer 1018 stated above to obtain the emitter taking-out electrode, a surface passivation layer consisting of an SiO₂ layer 0.4 μm thick, to which phosphor is added at 4 mol 100%, formed by gaseous phase chemical reaction and an SiO₄ layer 0.2 μm thick formed by the application method is formed to flatten the surface. Thereafter, after having formed throughholes at desired places in the surface passivation layer 1020, a metal layer is deposited over the whole surface by evaporation to obtain wiring and electrodes including bit lines 1021 by patterning (FIGS. 19A and 19B).

A semiconductor memory device of this embodiment is fabricated through the fabrication steps described above. In a memory cell based on this embodiment the area of the emitter-base junction of the transistor constituting the memory cell is almost equal to that of the collector-base junction. Consequently the transistor has a feature that it presents approximately same characteristics, if it is driven with the emitter and the collector replaced by each other. That is, the transistor of the memory cell based on this embodiment has bidirectional operation characteristics that it can be driven with exchanged roles of the emitter and the collector for data write-in and read-out, as indicated by the equivalent circuit in FIG. 19C, contrarily to the fact that it is not desirable to apply a bipolar transistor having the prior art structure, in which the collector-base junction is larger than the emitter-base junction, to the memory cell, for which the bidirectional operation, as described above, is required.

Figure 19A:
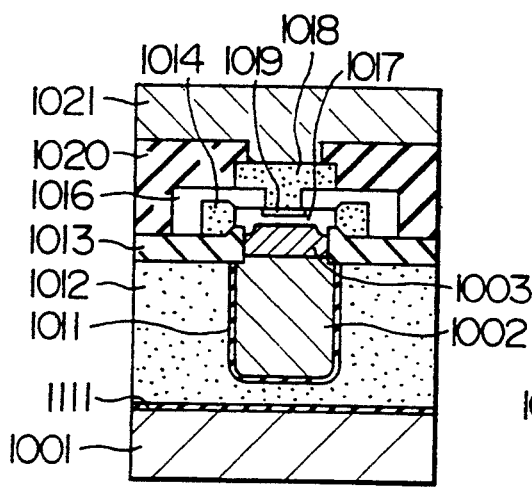
Figure 19B:
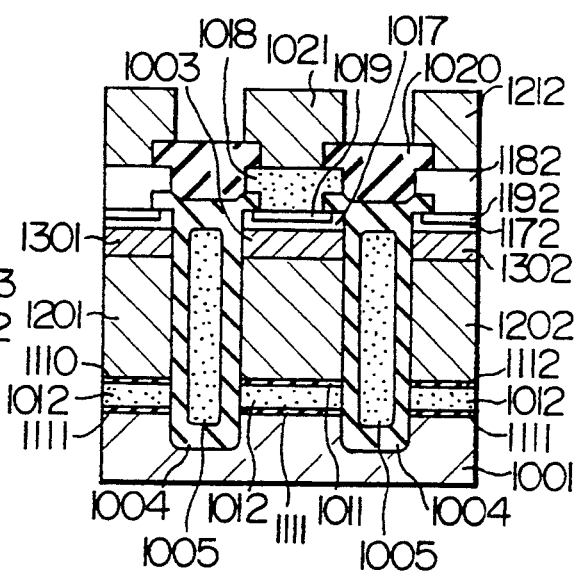
Figure 19C:
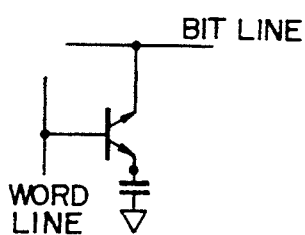
FIG. 19C is an equivalent circuit diagram of a semiconductor device obtained according to the fourth embodiment of this invention.

In the memory cell based on this embodiment and indicated in FIGS. 19A and 19B the polycrystalline Si layer 1012 acts as a plate electrode and constitutes a charge storing capacitor element together with the SiO₂ layer 1011 and the n⁺ conductivity type buried diffusion layer 1002. Data (charge) write-in and read-out to and from the capacitor element described above is effected by using the bipolar transistor having the bidirectional characteristics. Consequently the write-in and read-out operation is performed not by the method, by which variations in potential to the bit line 1021 are controlled, but by the current sense method. That is, the write-in control is made possible by the current control method using a sense amplifier circuit.

The memory cell based on this embodiment is characterized in that the capacitor element is constructed in the neighborhood of the n⁺ conductivity type buried layer 1002. For this structure data holding characteristics, i.e. refresh characteristics are limited by leak current at the collector-base junction and since the junction stated above is an n⁻ conductivity type epitaxial-p⁺ conductivity type graft base junction, leak current smaller than $10^{-15}$ A/cell and excellent refresh characteristics longer than 0.5 sec can be obtained. On the contrary, in a memory cell fabricated for comparison, in which the charge storing capacitor element is constructed in the emitter taking-out electrode portion on the emitter region 19 and the n⁺ conductivity type buried region 1002 is used as a bit line, the leak current is as great as $10^{-5}$ A/cell and it presents bad refresh characteristics. It is thought that this is due to the fact that the refresh characteristics are limited by the high impurity concentration junction characteristics of the p⁺ conductivity type graft base-n⁺ conductivity type emitter junction.

As described above, the memory cell based on this embodiment can be realized by modifying slightly the fabrication steps for a usual bipolar transistor. Consequently it has characteristics that peripheral circuits can be constructed by using bipolar transistors and the operation speed can be increased by one order of magnitude with respect to a DRAM based on conventional MOS transistors. That is, for a 4K-bit DRAM fabricated according to this embodiment, characteristics that the access time is shorter than 10 ns are verified. Further, in the memory cell according to this embodiment, it is so constructed that the base taking-out electrode 1014 used as a word line is connected at the side wall of the base region 1017 and that the base taking-out electrode 1014 at the connection portion is formed by self-alignment with the singlecrystal region. That is, in a plan view (per unit cell), there is only one contact tunnel for the connection of the bit line 1021 with the emitter region 19 and increase in the charge storing capacitance can be achieved without increasing the cell area. The increase in the storing capacitance can be easily achieved by increasing the area of the side wall portion of the n⁺ conductivity type buried layer. Consequently the occupation area of the memory cell according to this embodiment can be reduced to 8 μm², which is about ⅔ time as large as that of a memory cell consisting of a usual MOS transistor and a capacitor element on the basis of a same design rule (line width and interval of 0.8 μm). In the comparison described above the storing capacitance is 30 fF for both the cases.

Figure 43A:
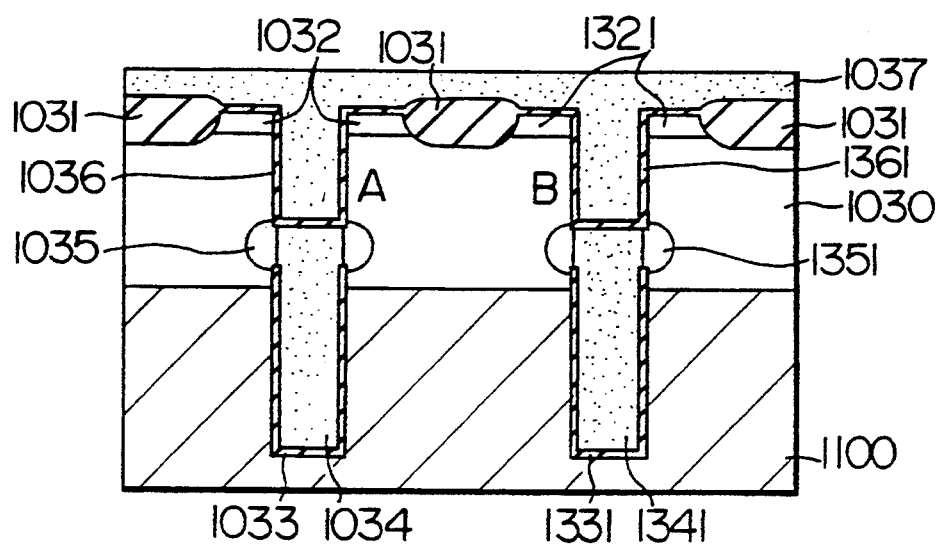
FIG. 43A is a cross-sectional view of a prior art semiconductor memory device.
Figure 43B:
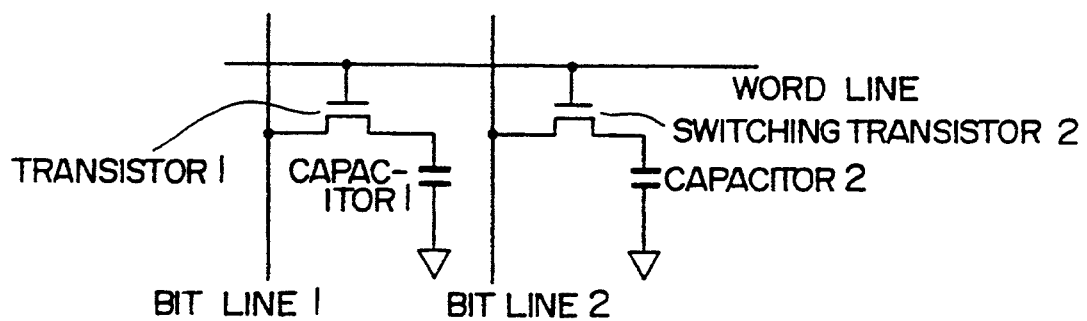
FIG. 43B is an equivalent circuit diagram of the device indicated in FIG. 43A.
Figure 44:
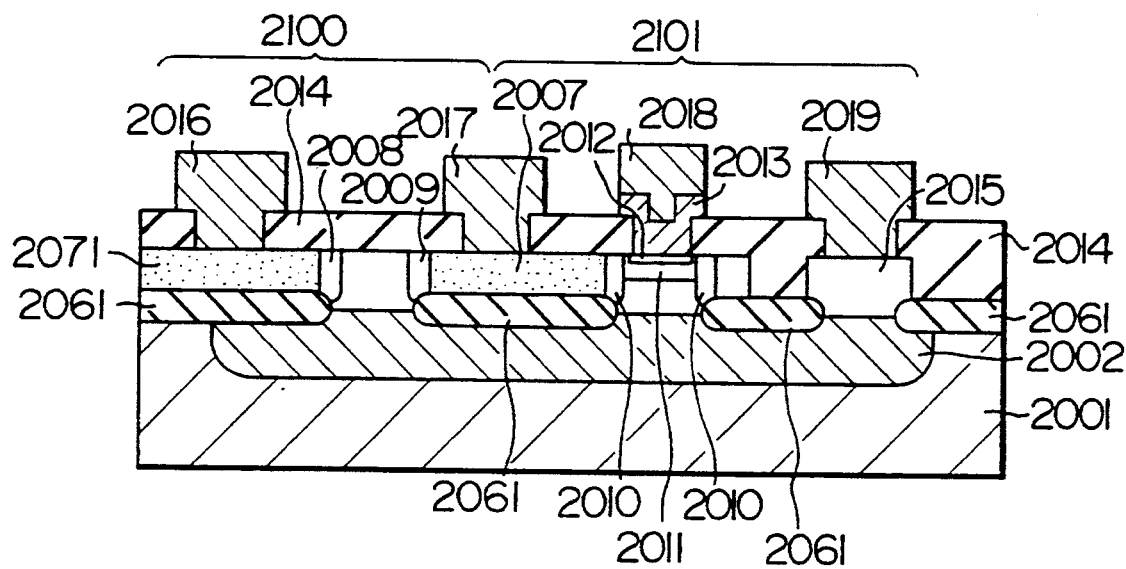
FIG. 44 is a cross-sectional view of a prior art bipolar transistor.
Figure 45:
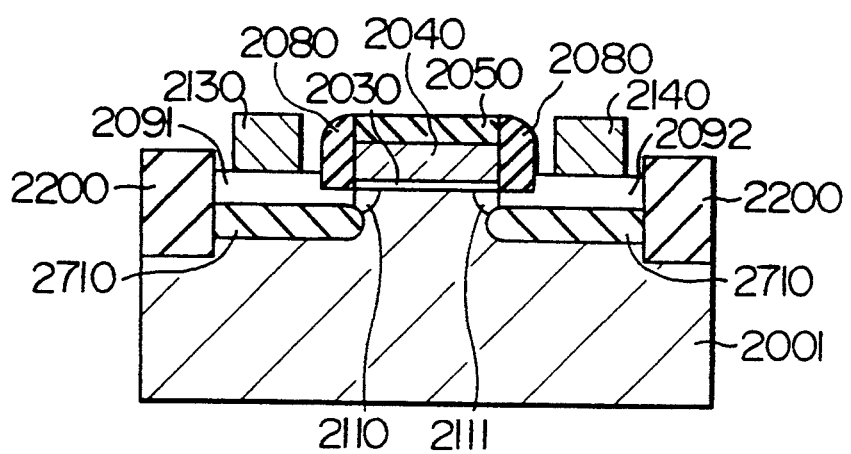
FIG. 45 is a cross-sectional view of a prior art MOS transistor.

The memory cell according to this embodiment corresponds to a so-called cross-point memory; in which a transistor and a capacitor element are formed right below the intersection of a word line with a bit line. However the memory cell according to this embodiment differs essentially from the prior art cross point memory as indicated in FIGS. 43A and 43B.

That is, in a memory device according to this embodiment unit cells are so constructed that adjacent two of them are isolated from each other by a plate electrode consisting of a polycrystalline Si layer 1012 and that all of them are isolated completely from the Si substrate 1001. Consequently fatal disadvantages such as interference between different cells, soft error misoperation due to α-ray irradiation, etc. can be essentially solved and in fact they are not found at all, which disadvantages were serious for the prior art memory cell indicated in FIGS. 43A and 43B. In particular, concerning the interference between different cells, no misoperation are found in the case where the interval between two adjacent cells is 0.5 μm and thus it is verified that a still increased degree of integration can be realized, as the design rule advances.

EMBODIMENT 5

Figure 20:
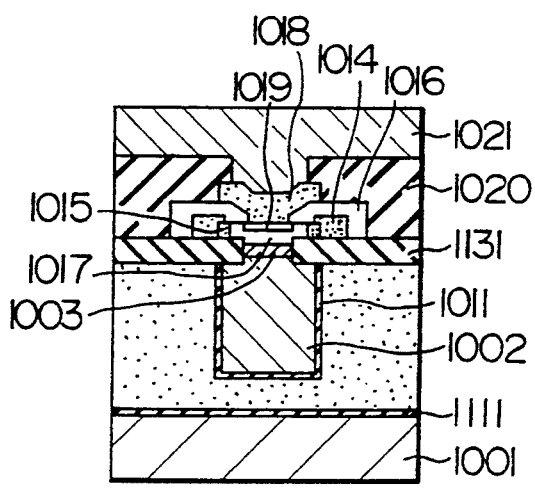
FIG. 20 is a cross-sectional view of a semiconductor memory device, which is a fifth embodiment of this invention.
Figure 21:
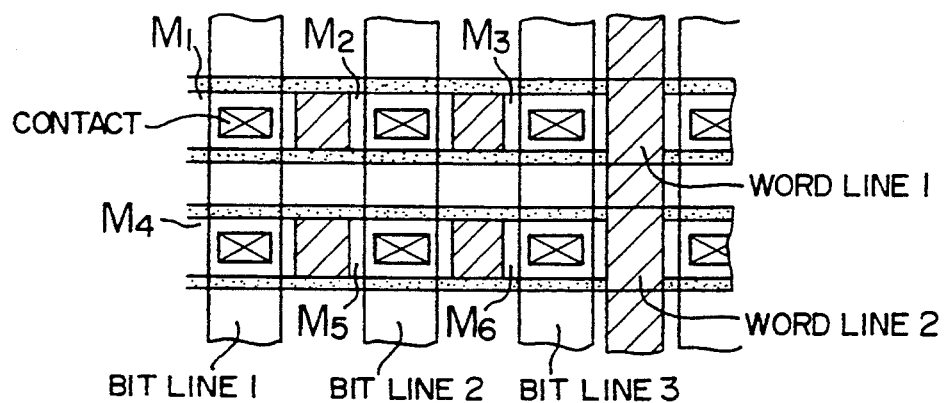
FIG. 21 is a plan view illustrating a semiconductor memory device according to this invention in a simplified manner.

FIG. 20 is a cross-sectional view illustrating still another embodiment of this invention; FIG. 21 is a plan view there of; and FIGS. 22A, 22B, 22C and 22D are schemes showing an SiO$_2$ layer at an opening portion supporting an active region in the fabrication process and the construction of unit cells.

In FIGS. 17A and 17B referred to for EMBODIMENT 4 described above, after having formed an isolating insulating layer 1013 0.1 μm on the polycrystalline Si layer 1012 doped with impurity, the lower portion of the Si$_3$N$_4$ layer 1010 at the side wall of the protruding portion of the Si substrate is selectively removed to expose the surface of the Si singlecrystal. The exposition stated above can be realized by forming further selectively a third Si$_3$N$_4$ layer on the side wall of the Si$_3$N$_4$ layer 1010 and removing it selectively as the construction of the Si$_3$N$_4$ layers 1009 and 1010 in FIGS. 16A and 16B.

After having exposed the Si surface at a region adjacent to the isolating insulating layer 1013 disposed on the side wall of the protruding Si single-crystal, it is subjected to a treatment in 30 minutes in a hydrazine mixed solution stated previously held at 50° C. to etch it selectively at a depth of 0.3 μm in the direction of <110>. In this state a wet oxidation is effected to grow an oxide layer also on the selectively etched surface while increasing the thickness of the isolating insulating layer and another isolating insulating layer 1131 is formed so as to insulate the lower portion of the region, where the graft base 1115 is to be formed, from the n+ conductivity type buried layer 1002. Thereafter, a semiconductor memory device is fabricated on the basis of EMBODIMENT 4 described previously.

In the semiconductor memory device based on this embodiment the isolating insulating layer 1131 is stretched under the p+ conductivity type graft base 1015 and thus it is so constructed that the effective interval to the n+ conductivity type buried layer 1002 is enlarged. As the result of the constructional improvement stated above the breakdown voltage between the base and the collector can be increased to 13 V, which is higher than that obtained by the prior art technique (5 V) by an amount as high as 8 V. In a semiconductor memory device fabricated according to this embodiment, in which the thickness of the epitaxial layer 1003 is reduced from 0.8 μm to 0.5 μm the breakdown voltage between the collector and the base is 7 V. On the other hand it is possible to increase the speed owing to the decrease in the thickness of the epitaxial layer 1003 so that an access time shorter than 7 ns can be obtained for a 4 K bit DRAM and it can be achieved to increase further the speed with respect to that based on EMBODIMENT 4 stated above.

Figure 22A:
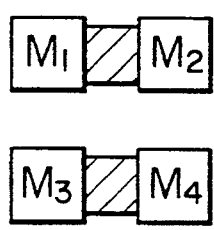
FIGS. 22A and 22B are schematized plan views illustrating the construction of memory cells.
Figure 22B:
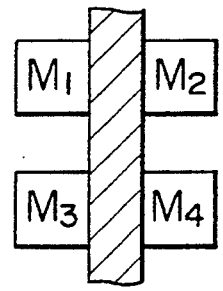

FIG. 21 is a simplified plan view of the semiconductor memory device according to this embodiment, in which a plurality of bit lines intersect perpendicularly a plurality of word lines and a unit cell (M$_N$: N is an integer) is constructed right below each of the intersections. The connection of each of the unit cells with a bit line is effected through a contact hole indicated in the figure, while the connection thereof with a word line is effected at the side wall portion of the unit cell. Each of the unit cells is isolated from the Si substrate by a plate electrode made of a polycrystalline Si layer. So to speak, the unit cell is constructed, as if it were a bridge floating on a river of the plate electrode and the SiO$_2$ region at an opening portion indicated by hatching in the figure is disposed so as to be stretched from the surface to the interior of the Si substrate. In this way it supports the unit cell by playing the role, as if it were a bridge pier. SiO$_2$ regions and unit cells may be so constructed that they are arranged alternately, that a pair of unit cells are assigned to an SiO$_2$ region at an opening portion, as indicated in FIG. 22A, or that a number of unit cells are assigned to an SiO$_2$ region at a stripe-shaped opening portion, as indicated in FIG. 22B.

Figure 22C:
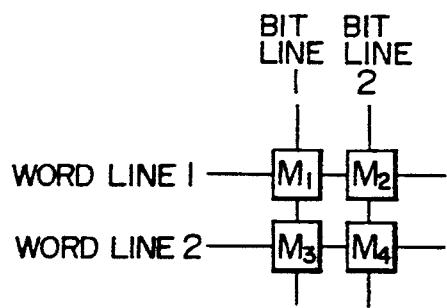
FIGS. 22C and 22D are schemes indicating wiring for memory cells.
Figure 22D:
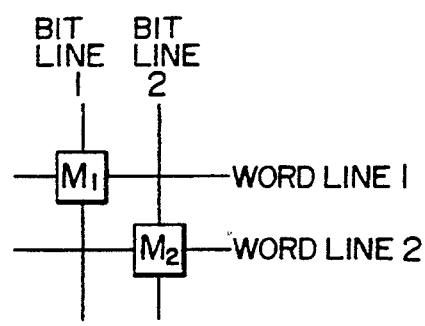

The construction of unit cells arranged on each of the bit liens may be effected either by the so-called open bit line method, by which memory cells are arranged at all two intersections of the word lines with the bit lines, as indicated in FIG. 22C or by so-called turn-back bit line method, by which a unit cell is arranged at two intersections, as indicated in FIG. 22D. To either one of the methods the semiconductor memory device according to this embodiment can be applied efficiently.

As clearly seen from the explanation for EMBODIMENTS 4 and 5 stated above, according to this invention, since the unit cells can be isolated from each other by the polycrystalline Si plate electrode, the interval between adjacent cells can be reduced to an extremely small value without fear of the interference therebetween and thus an effect to realize a superhigh integration is obtained. Further, according to this invention, since the unit cells are isolated also from the semiconductor substrate an effect to remove almost completely soft error misoperation due to α-ray irradiation can be obtained. Furthermore, according to this invention, concerning the improvement of the soft error misoperation stated above, not only the improvement of soft errors at the capacitor element portion, which is the storing node region, but also an effect to remove soft errors to the switching transistor region can be obtained.

In addition, according to this invention, since both the switching transistor and the capacitor element constituting the unit cell are located right below the intersection of the word line with the bit line and the number of contact holes in the plan view defining the occupation area can be reduced to 0.5 per unit cell, it is possible to realize hyperfine memory cells. Further, since the storing capacitor is constructed on the side wall and the bottom portion of the collector region, in spite of the hyperfine structure of the cell it is possible to keep the value of the storing capacitor sufficiently great.

Furthermore, according to this invention, since the memory cell can be fabricated by fabrication steps similar to those for bipolar transistors, it is desirable to design peripheral circuits with bipolar transistors. Consequently it has another effect that it is possible to realize a semiconductor memory device capable of performing a superhigh speed operation with respect to a prior art MOS type memory device. Further, according to this invention, since the n+ conductivity type collector region, which is the charge storing node, is connected with the high impurity concentration base region through the n− conductivity type epitaxial layer, it is possible to realize a semiconductor memory device, in which leak current is reduced to a value, which is smaller than $10^{-15}$ A and which is excellent in the refresh characteristics.

Now an embodiment of this invention concerning a semiconductor device, in which an insulating layer is buried for taking-out an electrode, will be explained.

EMBODIMENT 6

FIGS. 23 to 30 are cross-sectional views illustrating a sixth embodiment of the semiconductor device according to this invention in the order of fabrication steps.

At first, as indicated in FIG. 23, an n+ conductivity type buried layer 2002 1 μm deep, whose impurity concentration is $3 \times 10^{19}$ cm$^{-3}$, is selectively formed by the well-known Sb thermal diffusion method in a p conductivity type Si substrate 2001 having a resistivity of 10 Ω.cm, whose principal surface is (111). Then an epitaxial layer 2003 0.8 μm thick is grown over the whole surface. Thereafter, an SiO$_2$ layer 2020 50 nm thick formed by the thermal oxidation method, an Si$_3$N$_4$ layer 2021 120 nm thick formed by gaseous phase chemical reaction (hereinbelow designated as CVD) and an SiO$_2$ layer 2022 900 nm thick formed by the CVD method are superposed one after another on the surface of the epitaxial layer 2003 (FIG. 23).

Starting from the state indicated in FIG. 23, the three layered insulating layer 2020 to 2022 is patterned by the well-known photo-etching method. Subsequently the epitaxial layer 2003 is also etched at a depth of 0.3 μm. The etching of the epitaxial layer 2003 is made proceed only in the direction perpendicular to the principal surface of the Si substrate 2001 by the reactive ion etching method (FIG. 24).

From the state indicated in FIG. 24 a two-layered insulating layer 2023 consisting of an SiO$_2$ layer 2030 nm thick formed by the thermal oxidation method an Si$_3$N$_4$ layer 120 nm thick formed by the CVD method are superposed thereon over the whole surface. Then the two-layered insulating layer 2023 stated above formed in a plate parallel to the principal surface of the substrate 2001 is selectively etched by the reactive ion etching (hereinbelow designated as RIE) so as to be left only on the side wall of the pattern. Subsequently the exposed epitaxial layer 2003 is etched in the direction perpendicular to the principal surface of the substrate at a depth of 0.3 μm by the RIE method using patterned three-layered insulating layer 2020 to 2022 as a mask (FIG. 25).

Figure 26:
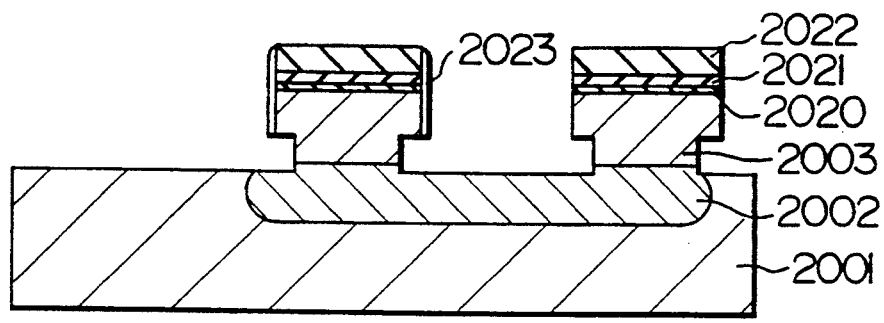

From the sate indicated in FIG. 25, a lateral tunnel 0.3 μm long is formed, as indicated in FIG. 26, by a treatment 25 minutes long using an etching solution, in which 80% hydrated hydrazine, isopropanol and a solution of Triton X (trade mark: surface active agent) at a concentration of 1% are mixed with a ratio of 200:20:1 at a temperature of 60° C. The direction of the length of the lateral tunnel, i.e. the direction parallel to the sheet of the figure is the direction of the (01$\bar{1}$) plane. At the etching stated above almost no etching proceeds in the direction of the (111) plane, which is perpendicular to the principal surface. The Si layer 2022 and the Si$_3$N$_4$ layer 2023 are not etched at all. In the direction of the ($\bar{2}$11) axis, i.e. direction perpendicular to the sheet of figure, the etching proceeds to a length of ⅓ of the height of the lateral tunnel, i.e. 0.1 μm and stops at a ($\bar{1}$11) plane, which is inclined with respect to the principal surface. This etching is effected not necessarily by using the hydrazine aqueous solution described previously, but it may be effected e.g. by using another etching solution having an anisotropic property such as a potassium hydroxide aqueous solution or by the gaseous phase dry etching. After having formed the lateral tunnel by using the hydrazine aqueous solution stated above, the Si$_3$N$_4$ layer 2023 remaining on the side wall in the region, where the collector is to be formed, is selectively etched by the microwave dry etching (FIG. 26).

From the state indicated in FIG. 26, in order to smooth the end portion of the lateral tunnel, the exposed surface of the Si substrate is etched isotropically at about 0.1 μm by using a solution of fluoric acid and nitric acid mixed with a ratio of 1:100. Thereafter, an SiO$_2$ layer 0.3 μm thick is formed on the exposed surface of the Si substrate by the selective thermal oxidation method using the two-layered insulating layer 2023 as an oxidation preventing layer, which SiO$_2$ layer serves as a buried insulating layer 6. Then the two-layered insulating layer 2023 used as the oxidation preventing layer is selectively removed by using a phosphoric acid solution heated at 180° C. At this time the end portion 0.3 μm long of the Si$_3$N$_4$ layer 2021 is also etched. Subsequently, after having deposited a polycrystalline (or amorphous) Si layer 2070 1.5 μm thick by the CVD method over the whole surface, boron (B) ions are implanted under a condition that the acceleration energy is 30 keV and the dose is $1 \times 10^{16}$ cm$^{-2}$ (FIG. 27).

Figure 27:
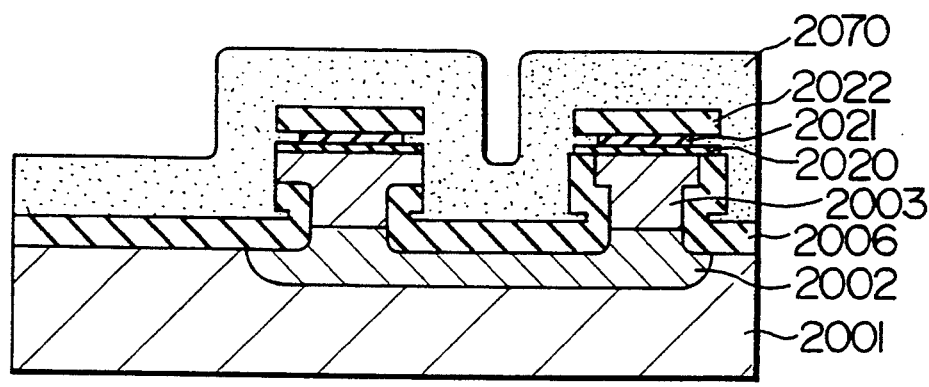

Starting from the state indicated in FIG. 27, after having formed a pattern of a photoresist film so as to be left only in the region where there exist recessed portions over 1 μm, another photoresist film 1 μm thick (not shown in the figure) is applied thereto so as to fill the recessed portions in order to flatten the surface. From this state these photoresist films are uniformly dry-etched to expose the surface of the polycrystalline Si layer 2070 on the protruding portions. Thereafter, microwave dry etching is made proceed from the exposed surface of the polycrystalline Si layer 2070 to remove selectively the polycrystalline Si layer 2070 on the SiO$_2$ layer 2022. Then the exposed SiO$_2$ layer 2022 is removed by using a fluoric acid aqueous solution (FIG. 28).

Figure 28:
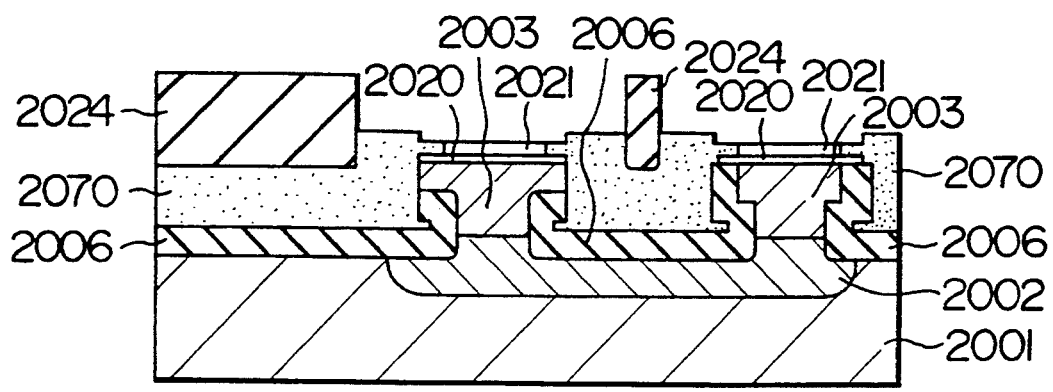

From the state indicated in FIG. 28, after having removed the photoresist film 2024, a heat treatment is effected at 900° C. for the purpose of activating boron atoms added to the polycrystalline Si layer 2070 and at the same time a graft base 2010 is formed. Thereafter, the polycrystalline Si layer 2070 is patterned according to the desired circuit structure to form the base taking-out electrode 2007. Then an SiO$_2$ layer 2014 0.25 μm thick is formed on the exposed base taking-out electrode 2007 by effecting a high pressure wet oxidation under a condition of 7 atm. and 900° C. Subsequently, after having removed the Si$_3$N$_4$ layer 2021 by using a hot phosphoric acid solution at 180° C., an Si$_3$N$_4$ layer (not shown in the figure) is deposited again over the whole surface by the CVD method. The Si$_3$N$_4$ layer stated above in the region, where the collector is to be formed, is selectively removed and an n+ conductivity type diffusion layer 2015 is formed by thermally diffusing phosphor (P) therethrough. From this state, after having formed an SiO$_2$ layer 2140 on the n+ conductivity type diffusion layer 15 by effecting again a wet oxidation, the Si$_3$N$_4$ layer stated above used as the mask for the selective P diffusion. Next, after having covered the surface outside of the region, where the base is to be formed, with a photoresist film, boron ions are implanted, using the photoresist film as a mask, under a condition that the acceleration energy is 10 keV and the dose is $1 \times 10^{14}$ cm$^{-2}$. After having removed the photoresist film, it is subjected to an activation heat treatment at 900° C. to form an intrinsic base region 2011 (FIG. 29).

Figure 29:
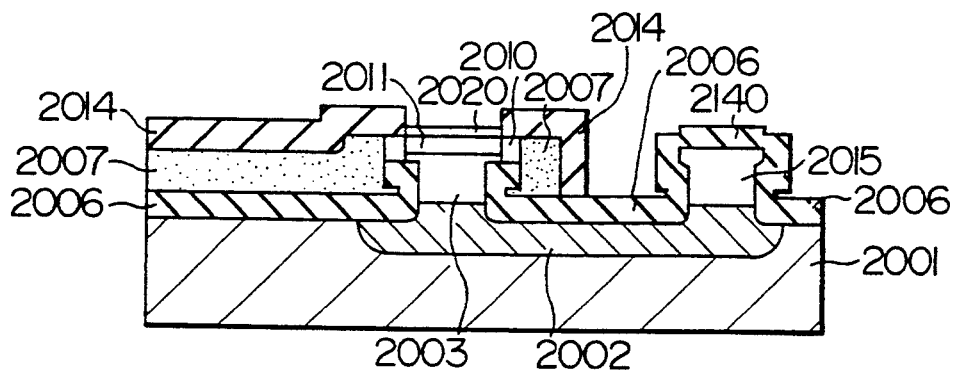
Figure 30:
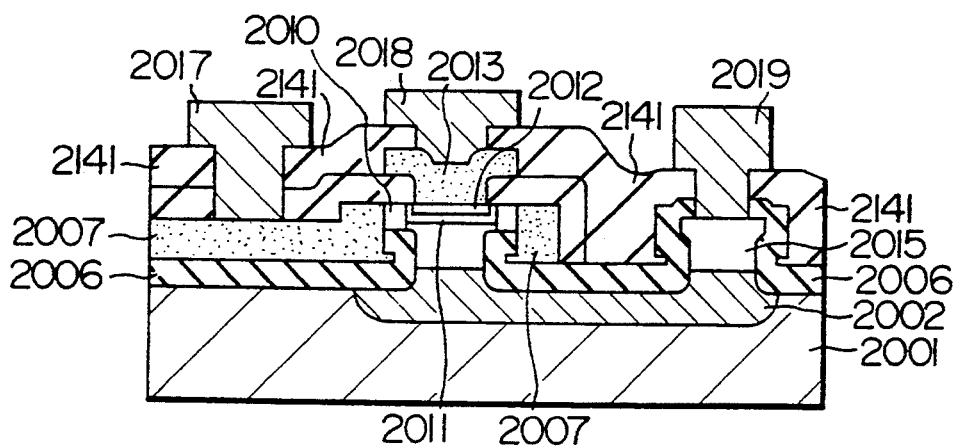

From the state indicated in FIG. 29, the SiO$_2$ layer 2020 is selectively removed to expose a part of the principal surface of the Si substrate 2001. After having deposited again a polycrystalline (or amorphous) Si layer, the emitter diffusion layer 2012 is formed by implanting arsenic (As) ions and effecting an activation heat treatment therefor. The As ion implantation is effected under a condition of 80 keV and $2 \times 10^{16}$ cm$^{-2}$ and the heat treatment is carried out at 950° C. Then the polycrystalline Si layer is patterned to form the emitter taking-out electrode 2013. Subsequently an SiO$_2$ layer 0.4 μm thick doped with phosphor at a concentration of 4 mol % by the CVD method and an SiO$_2$ layer 2141 0.12 μm thick by the application method are deposited over the whole surface to passivate and flatten the surface. Thereafter, electrodes and wiring including the base electrode 2017, the emitter electrode 2018 and the collector electrode 2019 are formed according to the desired circuit structure by patterning an Al layer 0.9 μm thick deposited by the vacuum evaporation method (FIG. 30).

The semiconductor device according to this embodiment is fabricated through the fabrication steps described above. A cross-section of the vertical type npn transistors based on this embodiment was observed by means of a transmission type electron microscope and it was verified that the end portion of the buried insulating layer 2006 reaches 0.4 μm away from the side surface of the singlecrystal Si substrate in the lateral direction so as to isolate completely the p+ conductivity type graft base region 2010 having a junction depth of 0.3 μm from the n+ conductivity type buried diffusion layer 2002. Although, in this embodiment, an example, in which etching is effected over a length of 0.3 μm in the direction parallel to the principal surface of the semiconductor substrate by the anisotropic etching, has been explained, the amount of etching stated above may be either increased or decreased if desired. Consequently it is possible to set the degree of the entering of the buried insulating layer 2006 in the lateral direction into the singlecrystal region at a desired value, independently of the thickness of the insulating layer 2006. Further, although description has been made on an example, in which the buried insulating layer 6 is an SiO$_2$ layer formed by thermal oxidation, the insulating layer 2006 may be based on another formation method such as the deposition method, etc. and it may be also another kind of insulating layer such as an Si$_3$N$_4$ layer or a multi-layered insulating layer.

As the result of the constructional improvement described above, according to this embodiment, the breakdown voltage between base and collector can be increased to 13 V, which is higher by 8 V with respect to that obtained by the prior art technique (5 V). Taking the increase in the breakdown voltage described above into account, a vertical type npn transistor based on this embodiment has been fabricated, in which the thickness of the epitaxial layer 2003 is reduced from 0.8 μm to 0.5 μm, i.e. to a value, which is ½ time as small as that obtained for the prior art structure and it was found that the breakdown voltage between base and collector is 7 V and that current intensity can be increased by a factor of 2.5 with respect to that obtained for the prior art structure. Further delay time in an ECL (emitter collector logic) ring oscillator fabricated on the basis of this embodiment was measured and high speed characteristics (30 ps), which was significantly improved with respect to those of the prior art technique (60 ps), was obtained. These characteristics are due to the fact that the graft base of the npn transistor based on this embodiment doesn't enter into the active region with respect to the prior at structure and consequently it is possible to improve the breakdown voltage between base and collector by the effective enlargement of the active region. As described above, it is possible to realize the decrease in the thickness of the n− conductivity type epitaxial layer 2003 and to drive the transistor with a higher speed.

EMBODIMENT 7

Figure 31:
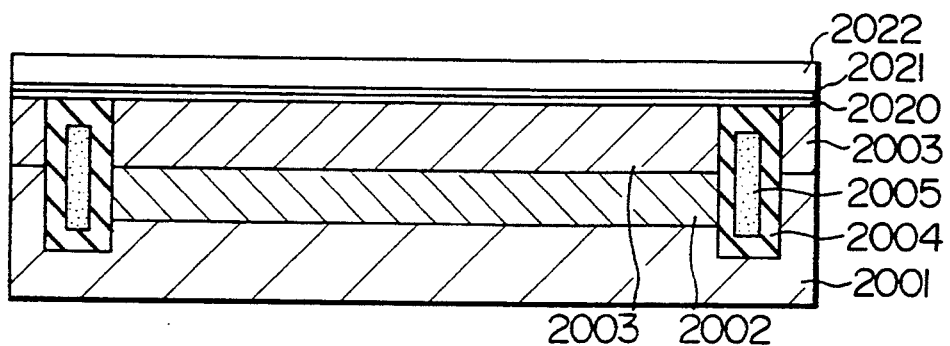
Figure 37:
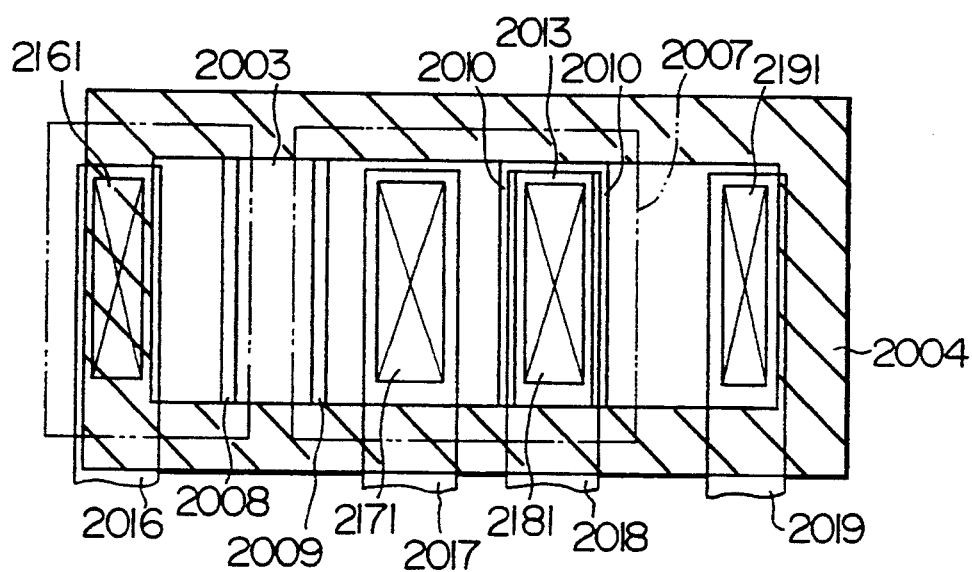
FIG. 37 is a plan view of the bipolar transistor indicated in FIG. 36.

FIGS. 31 to 36 are cross-sectional views illustrating a semiconductor device, which is a seventh embodiment of this invention, in the order of fabrication steps and FIG. 37 is a plan view showing the device indicated in FIG. 36. In this embodiment the emitter and the collector regions are so constructed that they are parallel to the <110> axis, which is perpendicular to the (111) plane. After having formed the epitaxial layer 2003 in EMBODIMENT 6, a trench 3 μm deep and 1.2 μm wide reaching the Si substrate 2001 is formed by the RIE method. By the method well-known as the U-shaped element isolation method a SiO$_2$ layer 2004 0.2 μm thick is formed in the trench, which is filled with a polycrystalline Si (or amorphous Si) layer 2005. The trench stated above is constructed so as to enclose the active region. Then, according to EMBODIMENT 6 SiO$_2$ layers 2020 and 2022 as well as an Si$_3$N$_4$ layer 2021 are formed (FIG. 31).

From the state indicated in FIG. 31, according to EMBODIMENT 6 described previously, the three-layered insulating layer 2020 to 2022 and the epitaxial layer 2003 are patterned. The patterning stated above is effected so that the active regions of the vertical type npn transistor and the lateral type pnp transistor in the direction of the <211> axis, which is perpendicular to the (111) plane and an end of the collector region of the vertical type npn transistor in the direction of <110> axis, which is perpendicular to the (111) plane are set by the U-shaped element isolation region or superposed partially on the polycrystalline Si layer 2005. Subsequently the two-layered insulating layer 2023 consisting of an SiO$_2$ layer and an Si$_3$N$_4$ layer is left on the side surface of the epitaxial layer 2003 thus patterned according to EMBODIMENT 6 (FIG. 32).

Figure 32:
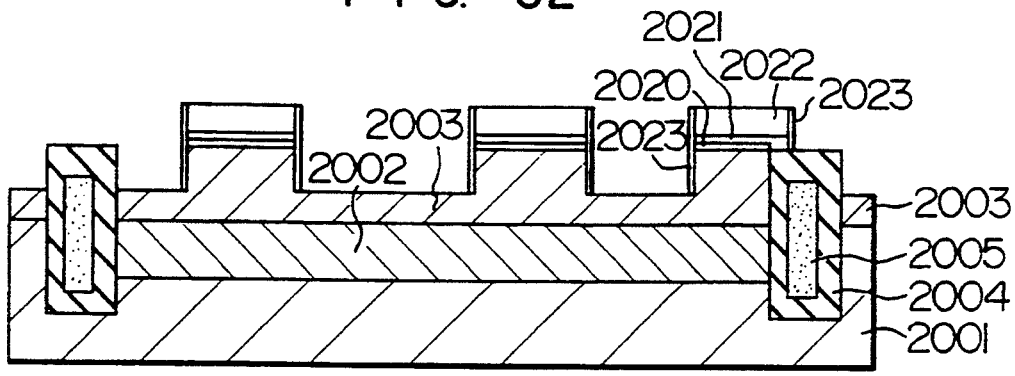

From the state indicated in FIG. 32 a lateral tunnel having a ceiling and a floor surface, which are parallel to the principal surface, and an innermost wall, which is perpendicular thereto, is formed in the Si substrate 2001 in the direction of the <111> axis, which is perpendicular to the (111) plane, according to EMBODIMENT 6. At this time, in the direction of the <211> axis, which is perpendicular to the <110> axis, the tunnel is defined by the element isolating insulating layer 2004 and thus the etching proceeds only two-dimensionally (FIG. 33).

Figure 33:
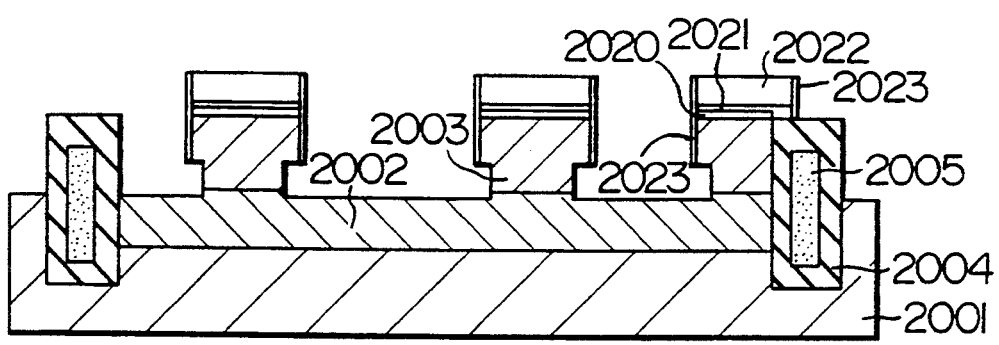
Figure 34:
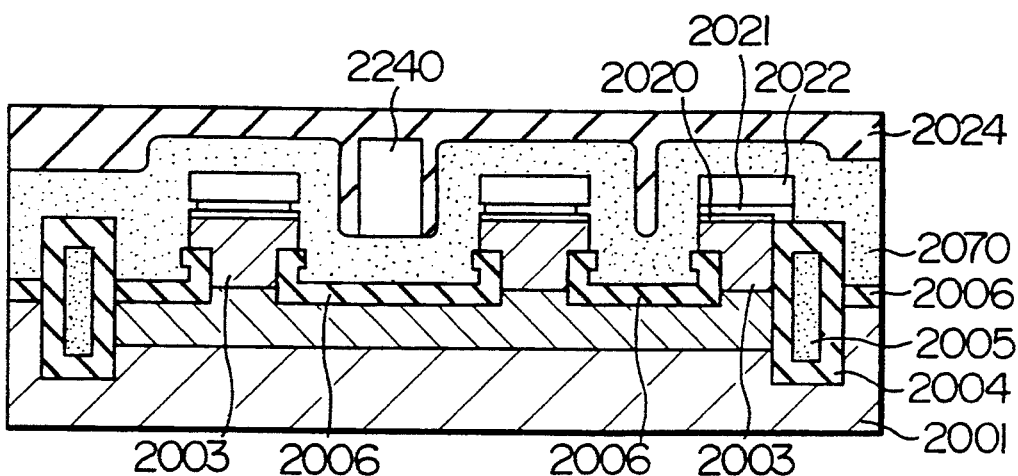

From the state indicated in FIG. 33 the formation of the buried insulating layer 2006, the deposition of the polycrystalline Si layer 2070, the setting of a photoresist film 2240 patterned for removing selectively the polycrystalline Si layer 2070 at the protruding portions and the application of the photoresist film 2024 over the whole surface are effected according to EMBODIMENT 6 (FIG. 34).

From the state indicated in FIG. 34 the steps following the etching step for flattening the photoresist films 2240 and 2024 are executed according to EMBODIMENT 6 described previously. However, in the step for forming the p+ conductivity type graft base 2010 by thermal diffusion of boron added in advance to the base taking-out electrode 2007, the p+ conductivity type emitter diffusion layer 2008 and the p+ conductivity type collector diffusion layer 2009 of the lateral type pnp transistor are formed in a similar manner. Thereafter, the $SiO_2$ layer 2014 is formed by oxidizing the base taking-out electrode 2007 and the emitter taking-out electrode 2071 of the lateral type pnp transistor according to EMBODIMENT 6 (FIG. 35).

The fabrication starting from the state indicated in FIG. 35 is executed according to EMBODIMENT 6. However, in the step for forming the n+ conductivity type emitter diffusion layer 2012 by diffusing As added in advance to the emitter taking-out electrode 2013, the polycrystalline Si layer used for the emitter taking-out electrode 2013 is removed in the region, where the lateral type pnp transistors is to be formed, so that an n+ conductivity type diffusion layer is formed in the surface portion of the epitaxial layer 2003. Thereafter, electrode and wiring including the emitter electrode, etc. are formed according to EMBODIMENT 6 described previously. FIG. 36 is a cross-sectional view of the semiconductor device fabricated according to this embodiment, in which the lateral type pnp transistor 2100 and the vertical type npn transistors 2101 are formed simultaneously. (In the figure a construction is illustrated, in which the base taking-out electrode 2007 of the vertical type npn transistor 2101 is connected with the collector of the lateral type pnp transistor 2100.) FIG. 37 is a plan view illustrating the semiconductor device based on this embodiment, in which reference numeral 2161 is a contact hole for the collector taking-out electrode 2071 of the lateral type pnp transistor 2100; 2171 is one for the base taking-out electrode 2007 of the vertical npn transistor 2101; 2181 is one for the emitter taking-out electrode 2013; and 2191 is one for the collector diffusion layer 2015. The semiconductor device based on this embodiment indicated in FIG. 37 is so constructed that the emitter 2008 and the collector 2009 of the lateral pnp transistor 2100 as well as the emitter 2012 and the collector 2015 of the vertical type npn transistor are arranged in the direction of the <110> axis, which is perpendicular to (111) and that in the direction perpendicular to the <211> axis, which is also perpendicular to (111) the active region is defined by the element isolating insulating layer 2004. By the construction described above, in the semiconductor device based on this embodiment, the buried insulating layer 2006 is formed parallelly both to the surface of the semiconductor substrate 2001 and to the (110) plane so that it can be isolated with uniform intervals from the p+ conductivity type graft base region 2010 and the n+ conductivity type buried layer 2002, independently of the position. Further, since the active region is defined by the element isolating insulating layer 2004 in the direction of the <211> axis, which is perpendicular to (111), no (111) plane, which is not parallel to the principal surface, is exposed by the anisotropic etch for forming the lateral tunnel, and no surface forming an acute angle is formed. The formation of a thick oxide layer at an acute angle portion is apt to produce crystal misoperation due to a difference in the thermal expansion coefficient between the oxide layer and the semiconductor substrate. In the semiconductor device based on this embodiment, a crystallographical observation was effected on the semiconductor substrate 2001 after the formation of the buried insulating layer by means of an electronic microscope and no crystal misoperation were found. Deficiencies due to crystal misoperation were evaluated by measuring the breakdown voltage using a structure, in which a number of vertical type npn transistors 2101 based on this embodiment were connected in parallel and a satisfactory result was obtained that the test standing ratio was 99,999%. The breakdown voltage between base and collector of the vertical type npn transistor 2101 based on this embodiment is 13 V, which is equal to the maximum value obtained for the vertical type npn transistor based on EMBODIMENT 6, and the transistor is excellent in the test standing ratio.

EMBODIMENT 8

FIGS. 38 to 41 are cross-sectional views illustrating an eighth embodiment of this invention in the order of fabrication steps and a cross-sectional view of the final product thereof, respectively. A groove burying element isolating insulating layer 2200 is formed in a desired position by using the well-known element isolating technique in the principal surface portion of a p conductivity type Si substrate 2001 having a resistivity of 10 $\Omega$cm, whose principal surface is (111) to divide and isolate an active region. A thin $SiO_2$ layer 15 nm thick is formed by the thermal oxidation method on the surface of the active region, which $SiO_2$ layer serves as a gate insulating layer 2030. Then a polycrystalline Si (or amorphous Si) layer 2040 is deposited and the resistance thereof is reduced by the thermal diffusion of phosphor using $POCl_3$. Subsequently a two-layered insulating layer 2050 consisting of an $Si_3N_4$ layer and an $SiO_2$ layer, both of which are deposited by gaseous phase chemical reaction, is formed. Thereafter the two-layered insulating layer 2050, the polycrystalline Si layer 2040 and the gate insulating layer 2030 are patterned one after another by using a well known photolithographic technique (not shown in the figure) as a mask to form a gate protecting insulating layer 2050 and a gate electrode 2040. Further the silicon substrate is etched only in the vertical direction at a depth of 0.3 $\mu$m by dry etching while leaving the photoresist film used for the patterning. Thereafter, after having removed the photoresist film stated above, the exposed surface of the silicon substrate 2001 to form an $SiO_2$ layer (not shown in the figure) 12 nm thick is formed. After that, an $Si_3N_4$ layer 2060 120 nm thick is deposited over the whole surface. From this state the $Si_3N_4$ layer 2060 stated above is etched in the direction perpendicular to the surface of the substrate by sputter ion etching to leave the $Si_3N_4$ layer 2060 only on the side wall portion of the gate electrode 2040, etc. (.FIG. 38).

Figure 38:
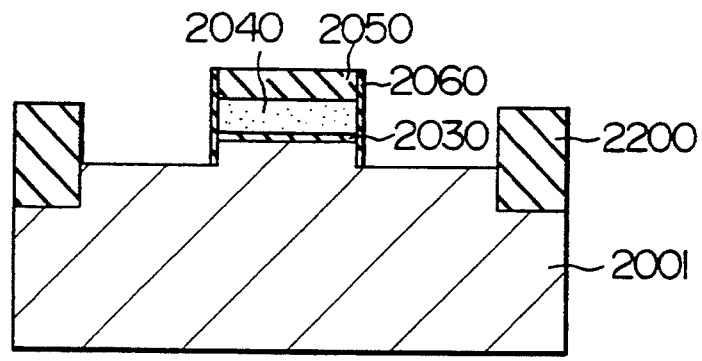
FIGS. 38 to 41 are cross-sectional views illustrating fabrication steps for fabricating an MOS transistor, which is an eighth embodiment of this invention.

From the state indicated in FIG. 38 the silicon substrate 2001 is further etched at a depth of 0.3 $\mu$m in the vertical direction by the sputter ion etching method by using the two-layered insulating layer 2050 and the element isolating insulating layer 2200 as a mask. From this state the exposed surface of the silicon substrate 2001 is etched by using an etching solution, in which 80% hydrated hydrazine, isopropanol and a solution of Triton X (trade mark: surface active agent) at a concentration of 1% are mixed with a ratio of 200:20:1. The temperature of the etching solution is held at 10° C. By the etching method stated above, since almost no etching proceeds in the direction of the <111> axis, the silicon substrate is not etched along planes parallel to the principal surface thereof, which is (111). Further neither the SiO₂ layer nor the Si₃N₄ layer are etched at all. Therefore the gate electrode 2040 covered by the element isolating insulating layer 2200, the gate protecting insulating layer 2050 and the Si₃N₄ 2060 is not etched, too. In the case where the direction of the gate length of the gate electrode 2040 on the principal surface, which is (111), is set to <211>, which is perpendicular to (111), the amount etched by the step stated above in the semiconductor substrate 2001 under the gate electrode 2040, i.e. the length of the lateral tunnel doesn't depend on the duration of the etching, but it is $\frac{1}{3}$ of the height of the lateral tunnel, i.e. 0.1 μm. In the case where the principal surface of the semiconductor substrate is (111), either one of the planes ($\bar{1}$11), (1$\bar{1}$1) and (11$\bar{1}$) appears at the innermost surface of the lateral tunnel and it can be thought that the etching is stopped there and proceeds any more. The step stated may be effected by any other etching solution such as e.g. a potassium hydroxide (KOH) aqueous solution, if the etching speed varies remarkably, depending on the crystallographical surface orientation of the semiconductor substrate. Further the etching is not necessarily effected by using a solution, but it may be based on the dry etching method (FIG. 39).

Figure 39:
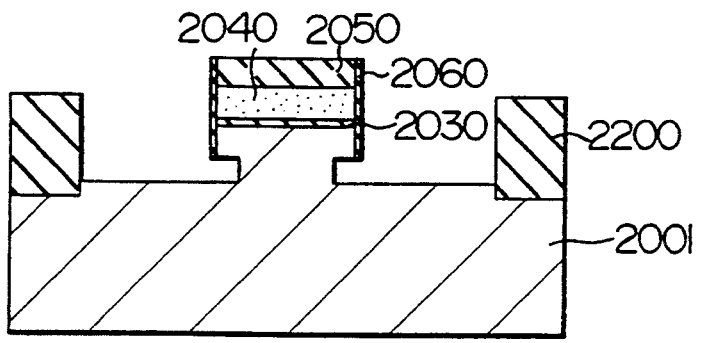

From the state indicated in FIG. 39 the whole exposed part of the semiconductor substrate is etched at a depth of about 0.1 μm. The etching is effected by using a solution of fluoric acid/nitric acid mixed with a ratio of 1/20. Thereafter, thermal oxidation is effected by using the Si₃N₄ layer 2060 and the gate protecting insulating layer 2050 as an oxidation preventing layer to form an SiO₂ layer 0.3 μm thick on the exposed surface of the semiconductor substrate 2001, which SiO₂ layer serves as a buried insulating layer 2070. Next, after having selectively removed the Si₃N₄ 2060 exposed and left by using a phosphoric acid solution heated at 160° C., an SiO₂ layer 0.2 μm thick is formed selectively on the side wall of the gate electrode 2040 doped with phosphor at a high concentration by the wet oxidation method at 800° C. The thin SiO₂ layer 50 μm thick formed on the surface of the low impurity concentration substrate by the thermal oxidation step stated above is removed and a gate side wall insulating layer 2080 0.15 μm thick is formed selectively on the side wall portion of the gate electrode 2040. From this state, after having deposited a polycrystalline Si layer 2090 0.9 μm thick by gaseous phase chemical reaction, phosphor (P) ions are implanted under a condition that the acceleration energy is 80 keV and the dose is 5×10¹⁵ cm⁻². Thereafter a heat treatment is effected in 10 minutes at 950° C. in an N₂ ambient to activate implanted ions and to form a source diffusion layer 2110 and a drain diffusion layer 2111 within the Si substrate 1 (FIG. 40).

Figure 40:
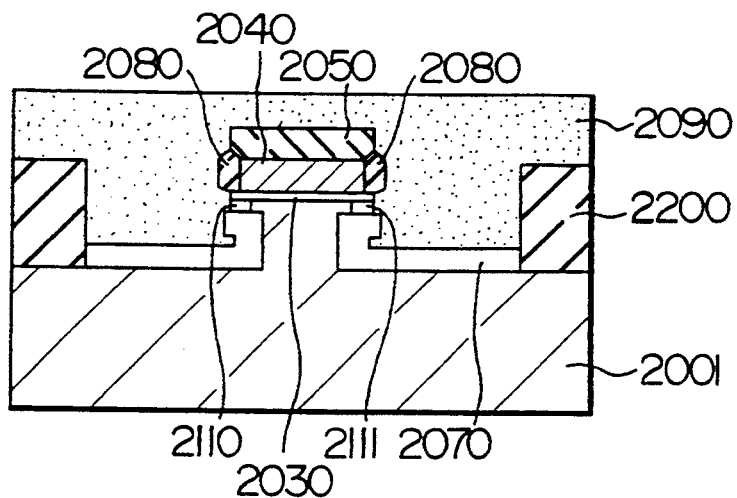
Figure 41:
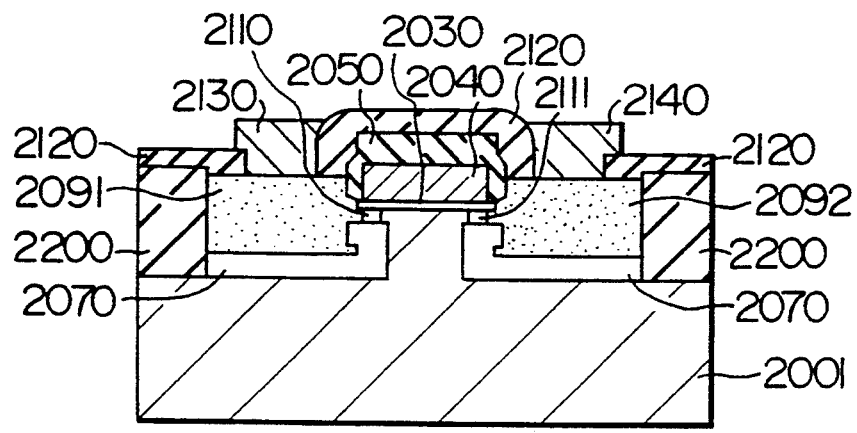
Figure 42:
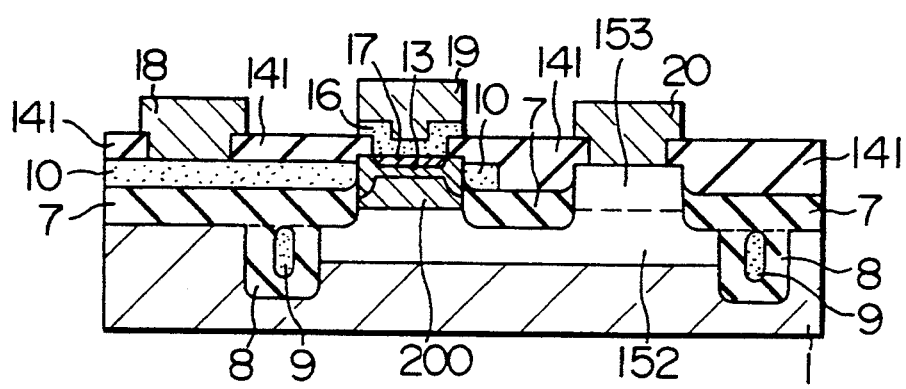
FIG. 42 is a cross-sectional view of a prior art semiconductor device having a buried layer.

Starting from the state indicated in FIG. 40, the polycrystalline Si layer 2090 is etched in order to flatten the surface and a source taking-out electrode 2091 and a drain taking-out electrode 2092, which are isolated from each other, are formed. Then an SiO₂ layer doped slightly with phosphor is deposited at a thickness of 0.5 μm, which SiO₂ layer serves as a surface passivation layer 2120. Finally contact-holes are formed at desired positions in the surface passivation layer 2120 and electrodes and wiring including a source electrode 2130 and a drain electrode 2140 are formed by depositing an electrode wiring layer, whose principal component is Al, and patterning it according to a desired circuit construction (FIG. 41).

The semiconductor device is fabricated through the fabrication steps stated above. In a transistor, in which the orientation of the gate electrode is set in advance so that the source-drain direction is (0$\bar{1}$1) or (01$\bar{1}$), in the state indicated in FIG. 39, the ceiling portion and the floor portion in the surface of the lateral tunnel formed in the substrate right below the gate electrode 2040 are (111) and the innermost surface of the lateral tunnel is (110), which is perpendicular to (111). Concerning the gate width direction, i.e. the direction perpendicular to the sheet of FIG. 39, the lateral tunnel is defined by the end portion of the element isolating insulating layer (not shown in the figure). The ceiling surface of the lateral tunnel is (111), which is in the relation that it is strictly parallel to the principal surface of the substrate. Consequently the singlecrystal layer formed on the buried insulating layer 2070 by thermally oxidizing the ceiling surface stated above has a uniform and extremely small thickness. For the semiconductor device based on this embodiment it was confirmed by cross-section observation that the singlecrystal layer is formed uniformly with a thickness of 75 nm. The breakdown voltage between source and drain was measured for an MOS transistor having a gate length of 0.5 μm and an effective channel length of 0.3 μm and fabricated on the basis of this embodiment and a value as high as about 9.5 V was obtained. For a transistor fabricated at the same time for comparison having the same gate size and a conventional structure it was about 4.5 V and restricted by the punchthrough voltage. It was found from the comparison of the breakdown voltage that for the MOS transistor based on this embodiment the punchthrough voltage is increased by a factor of about 2 with respect to that of the conventional prior art structure. Further MOS transistors having different gate lengths were fabricated on the basis of this embodiment and the dependence of the threshold voltage on the gate length was measured for a drain voltage of 5 V and it was found that the gate length, for which the threshold voltage of a transistor having a sufficiently long gate length (5 μm) is lowered by 0.5 V, is 0.2 μm. On the other hand, for a transistors having a usual structure the corresponding gate length is 0.8 μm and it was verified that the short channel effect is remarkably improved by the structure based on this embodiment. That is, on the basis of this embodiment the transistor can work with a high reliability by the usual source voltage of 5 V. Consequently it is possible to realize a hyperfine transistor capable to be driven with a high speed, whose short channel effect is extremely small.

It is possible to reduce further the thickness of the singlecrystal layer remaining on the buried insulating layer by forming the buried insulating layer 2070 with a great thickness or by bringing the lateral tunnel formed in the substrate 2001 closer to the principal surface of the substrate. Short channel effect characteristics of an MOS transistor, whose singlecrystal layer is 30 nm thick, based on this embodiment, were evaluated, and it became clear that also in a transistor, whose effective gate length is 0.1 μm, the threshold voltage is lowered only by 0.3 V with respect to that of a long channel transistor and that the thinner the singlecrystal layer is, the more the short channel effect is improved. Hyperfine transistors having various thicknesses of the singlecrystal layer were fabricated on the basis of this embodiment and their short channel effect characteristics were evaluated. It was found that there is a tendence that the short channel effect is improved, if the thickness of the singlecrystal layer on the buried insulating layer is smaller than 0.2 μm, and in particular it is remarkable, if the thickness is smaller than 0.1 μm.

Although description has been made on a single transistor for the sake of convenience in the embodiment stated above, this embodiment can be applied also to a semiconductor integrated circuit device, in which a plurality of transistors are disposed on a same substrate, whose principal surface is (111). In this case a plurality of transistors having a conventional well-known structure may be disposed mixedly on a common substrate together with a plurality of transistors based on this embodiment. In the structure described above it is preferable that the gate length direction of the plurality of transistors based on this embodiment is set in the direction of $<110>$.

Further, although a case where the buried insulating layer 2070 is constructed under the source diffusion layer 2110 and the drain diffusion layer 2111 has been described in this embodiment, if desired, the transistor may be so constructed that only one of them is formed on the basis of this embodiment and the other is made of a diffusion layer of usual structure. In addition, although this embodiment concerns an n channel type transistor, it is a matter of course that this invention can be applied also to a p channel type transistor and a CMOS construction consisting of an n channel type transistor and a p channel type transistor.

EMBODIMENT 9

A semiconductor device is fabricated according to EMBODIMENT 6, in which a substrate having a principal surface perpendicular to the $<332>$ axis, which is inclined by about 10° from the $<111>$ axis towards the $<110>$ direction, is used as the Si substrate 2001 in EMBODIMENT 8 described above. In this embodiment the source-drain direction is set to $<\bar{1}10>$ or $<1\bar{1}0>$ and the gate width direction to $<\bar{1}\bar{1}3>$. As results of a cross-section observation it was found that the ceiling and the floor surfaces of the lateral tunnel formed in the silicon substrate by using a hydrazine mixed solution are parallel to the principal surface, which is a (332) plane. The innermost surface of the lateral tunnel was perpendicular to the ceiling and the floor surfaces. The side wall surface of the lateral tunnel was defined by the element isolating insulating layer 2200. The buried insulating layer 2070 was formed by oxidation of the wall surface of the lateral tunnel. A plurality of n channel type MOS transistors having various intervals between buried insulating layers 2070 were fabricated, while keeping the thickness of the singlecrystal layer on the buried insulating layer 2070 at 50 nm. The effective channel length of the transistors was set to 0.5 μm and the buried insulating layer was 0.1 μm thick. The interval d between buried insulating layers was made vary by controlling the amount of etching for the lateral tunnel. The breakdown voltage between source-drain of the transistors was measured and it was found that the breakdown voltages are 7.5 V, 9 V and 11 V for the transistors, in which the intervals are 0.4, 0.3 and 0.2 μm, respectively. However no breakdown voltage increasing effect was found for the transistors having values of d greater than 0.5 μm.

In this embodiment for the semiconductor devices, in which a substrate, whose principal surface was perpendicular to the $<221>$ axis, which was inclined by about 16° from the $<111>$ axis towards the $<110>$ direction, was used, and the source-drain direction was set to a direction $<\bar{1}10>$ or $<1\bar{1}0>$, (221) planes parallel to the principal surface for the ceiling and the floor surfaces of the lateral tunnel were obtained. On the contrary, for the semiconductor devices, in which a substrate, whose principal surface was perpendicular to the $<331>$ axis, which was inclined by about 22° from the $<111>$ axis towards the $<110>$ direction, (111) planes inclined by 22° with respect to the principal surface appeared for the ceiling and the floor surfaces of the lateral tunnel and no singlecrystal layer having a uniform thickness was obtained on the buried insulating layer 2070.

Further, in the semiconductor device based on this embodiment using a substrate, whose principal surface was perpendicular to the $<223>$ axis, which was inclined by about 11° from the $<111>$ axis towards the $<001>$ direction, a lateral tunnel having the ceiling and the floor surfaces parallel to the principal surface was formed. On the contrary, in the semiconductor device based on this embodiment fabricated with a surface perpendicular to the $<113>$ axis inclined by about 30° from the $<111>$ axis towards the $<001>$ direction as the principal surface, no lateral tunnel having the ceiling and the floor surfaces parallel to the principal surface was formed.

The results described above indicate that for the planes inclined by an angle greater than about 20° with respect to (111) it is possible to construct the lateral tunnel so that the ceiling and the floor surfaces are parallel to the principal surface, that it has a depth set in advance, and that consequently it is possible to leave an extremely thin singlecrystal layer on the buried insulating layer 70 with a good reproducibility and controllability but with a crystallographical surface inclined by an angle greater than about 20° the left extremely thin singlecrystal layer cannot be controlled. In a semiconductor device fabricated on the basis of this embodiment, using the former crystallographical plane as the principal surface, if the transistor is so constructed that the interval between buried insulating layers 2070 is smaller than the effective channel length, effects similar to those obtained for the transistor based on EMBODIMENT 6 described previously, i.e. the increase in the breakdown voltage between source-drain and the improvement of the short channel effect are obtained.

As explained in EMBODIMENTS 6, 7, 8 and 9, according to this invention, it is possible to introduce the buried insulating layer by the self-alignment with the side wall of the semiconductor substrate, i.e. the buried insulating layer having constant dimensions parallel to the principal surface of the semiconductor substrate. This invention utilizes the crystallographical orientation as the principle and since the setting of the buried insulating layer can be controlled with an extremely high precision, the decrease in the size of hyperfine transistors is not at all impaired.

In the application to the bipolar transistor, since the buried insulating layer can be controlled as desired, the crystallinity of the semiconductor substrate on the buried insulating layer is not impaired and the breakdown voltage between base and collector can be increased by a factor greater than 2 with respect to that obtained by the prior art technique. Consequently, in the case where the breakdown voltage between base and collector is designed so as to be higher than a desired value, since the epitaxial layer can be constructed to be thinner and it is not necessary to make the graft base region enter into the intrinsic base, the active region can be remarkably increased with respect to the prior art structure. As the result, since the current density can be increased significantly, it is possible to realize a transistor having a hyperfine structure and an ultrahigh speed. In the application to the MOS transistor, since it is possible to construct the insulating layer at desired positions in the single-crystal semiconductor substrate under the gate electrode owing to the self-alignment with the gate electrode. Furthermore, since the crystallographical orientation is utilized, when the crystallographical orientation of the principal surface of the used semiconductor substrate is determined, the setting of the region, where the insulating layer is constructed, can be controlled with an extremely high precision. In addition, the single-crystal region on the insulating layer described above is originally good singlecrystal, which is not worsened by the process according to this invention. Further, since it is possible to realize a structure, in which all the side surface regions of the junction except for the channel region of the source-drain junction are replaced by insulating layers, the punchthrough current path can be almost completely interrupted. Consequently, the so-called short channel effect, by which the threshold voltage is varied as the gate length becomes shorter, can be remarkably improved. In particular, also for the transistors, whose effective channel length is greater than 0.1 $\mu$m, characteristics, by which the short channel effect is small, can be realized. Furthermore, according to this invention, since all the floor surface portion of the source-drain junction and the most part of the side surface portion can be replaced by an insulating layer having a low dielectric constant and a great layer thickness, the in-and out-put capacitance can be significantly reduced. As the result, an effect to increase the operation speed can be also obtained.

We claim:

1. A semiconductor device comprising:
   a single crystal semiconductor substrate;
   a polycrystalline semiconductor region having a low resistance and disposed to overlie a surface of said semiconductor substrate; and
   a single crystal semiconductor region disposed to directly overlie in a stacked relation, perpendicular to the substrate surface, said polycrystalline semiconductor region, said single crystal semiconductor region comprising a first layer of a first conductivity type, a second layer of a second conductivity type and a third layer of said first conductivity type disposed one under another downward from a surface thereof,
   wherein the surface of said substrate is a (111) plane.

2. A semiconductor device according to claim 1, wherein a semiconductor layer having a low resistance is disposed between said polycrystalline semiconductor region and said single crystal semiconductor region and/or said semiconductor substrate.

3. A semiconductor device according to claim 1, wherein said polycrystalline semiconductor region is comprised of a first portion extending in a lateral direction parallel to the substrate surface, and a second portion contiguous to said first portion and extending in an orthogonal direction to said first portion and toward the substrate surface.

4. A semiconductor device according to claim 3, wherein the second portion of said polycrystalline semiconductor region and said single crystal semiconductor region are insulated from each other by a thick insulating layer.

5. A semiconductor device comprising:
   a single crystal semiconductor substrate;
   an insulating region disposed on a surface of said single crystal semiconductor substrate;
   a polycrystalline semiconductor region having a low resistance and disposed on said insulating region; and
   a single crystal semiconductor region disposed to directly overlie in a stacked relation, perpendicular to the substrate surface, said polycrystalline semiconductor region.

6. A semiconductor device according to claim 5, wherein the surface of said substrate is a (111) plane.

7. A semiconductor device according to claim 5, wherein said polycrystalline semiconductor region is comprised of a first portion extending in a lateral direction, parallel to the substrate surface, and a second portion contiguous to said first portion and extending in an orthogonal direction to said first portion and toward the substrate surface.

8. A semiconductor device according to claim 7, wherein the second portion of said polycrystalline semiconductor region and said single crystal semiconductor region are insulated from each other by a thick insulating layer.

9. A semiconductor device according to claim 5, wherein said single crystal semiconductor region comprises a first layer of first conductivity type, a second layer of second conductivity type and a third layer of said first conductivity type disposed one under another downward from a surface thereof, said third region being electrically connected to said polycrystalline semiconductor region.

10. A semiconductor device according to claim 9, wherein said first layer, said second layer and said third layer are an emitter, a base and a collector of a bipolar transistor, respectively.

11. A semiconductor device according to claim 5, wherein a silicide layer is formed on said single crystal semiconductor region, and wherein together said silicide layer and said single crystal semiconductor region form a Schottky barrier type diode.

12. A semiconductor device according to claim 5, wherein said polycrystalline semiconductor region is a polycrystalline silicon region.

* * * * *